United States Patent [19]

Chan et al.

[11] Patent Number: 5,580,429
[45] Date of Patent: Dec. 3, 1996

[54] METHOD FOR THE DEPOSITION AND MODIFICATION OF THIN FILMS USING A COMBINATION OF VACUUM ARCS AND PLASMA IMMERSION ION IMPLANTATION

[75] Inventors: Chung Chan, Newton; Ryne C. Allen, Framingham; Imad Husein, Boston; Yaunzhong Zhou, Malden, all of Mass.

[73] Assignee: Northeastern University, Boston, Mass.

[21] Appl. No.: 475,002

[22] Filed: Jun. 7, 1995

Related U.S. Application Data

[63] Continuation-in-part of Ser. No. 225,844, Apr. 11, 1994, Pat. No. 5,441,624, which is a continuation-in-part of Ser. No. 934,925, Aug. 25, 1992, Pat. No. 5,302,271.

[51] Int. Cl.$^6$ ..................................................... C23C 14/32
[52] U.S. Cl. ................................ 204/192.38; 204/298.41; 427/580
[58] Field of Search ......................... 204/192.38, 298.41; 427/580

[56] References Cited

U.S. PATENT DOCUMENTS

| | | | |
|---|---|---|---|
| 3,158,805 | 11/1964 | Kalbfell | 360/1 |
| 4,917,786 | 4/1990 | Ehrich | 204/192.38 |
| 4,929,322 | 5/1990 | Sue et al. | 204/192.38 |
| 5,013,578 | 5/1991 | Brown et al. | 427/455 |
| 5,096,558 | 3/1992 | Ehrich | 204/192.38 |
| 5,104,509 | 4/1992 | Buck et al. | 204/192.38 |
| 5,279,723 | 6/1994 | Falabella et al. | 204/192.38 |
| 5,401,543 | 3/1995 | O'Neill et al. | 427/580 |
| 5,458,754 | 10/1995 | Sathrum et al. | 204/192.38 |

OTHER PUBLICATIONS

Bababeygy, S., "Corrosion Protection by Vacuum Arc Coatings," Interfinish 88, Paris, Oct. 1988.

Bacon, F. M., "Vacuum Arc Anode Plasma. I. Spectroscopic Investigation," Journal of Applied Physics, vol. 46., No. 11, Nov. 1975, pp. 4750–4757.

Boxman, R. L., et al., "Principles and Applications of Vacuum Arc Coatings," XIIIth Internation Symposium on Discharges and Electrical Insulation in Vacuum, Paris, 1988.

Ehrich, H., et al., "The Anodic Vacuum Arc. I. Basic Construction and Phenomenology," Jun. 1987, pp. 134–138.

Ehrich, H., et al., "The Anodic Vacuum Arc. II. Experimental Study of Arc Plasma," Sep. 1987, pp. 2499–2502.

Grissom, J. T., et al., "Anode Surface Radiance From Microsecond Vacuum Arcs," Journal of Applied Physics, vol. 45, No. 7, Jul. 1974, pp. 2885–2894.

Kimblin, C. W., "Anode Voltage Drop and Anode Spot Formation in dc Vacuum Arcs," Journal of Applied Physics, vol. 40, No. 4, Mar. 1969, pp. 1744–1752.

Miller, H. Craig, "A Review of Anode Phenomena in Vacuum Arcs," IEEE Transactions on Plasma Science, vol. PS–13, Oct. 1985, pp. 242–252.

Sroda, T., et al., "Plating–free metal ion implantation utilizing the cathodic vacuum arc as an ion source," Applied Physics Letters, vol. 60, 1076–1078 (1992).

Storer, J., et al., "Transport of Vacuum Arc Plasma Through Straight and Curved Magnetic Cuts," Journal of Applied Physics, vol. 66, No. 11, Dec. 1989, pp. 5245–5250.

*Primary Examiner*—Aaron Weisstuch
*Attorney, Agent, or Firm*—Weingarten, Schurgin, Gagnebin & Hayes

[57] ABSTRACT

Cathodic/anodic vacuum arc sources with plasma ion implantation deposition system for depositing high quality thin film coatings of complex compounds on a workpiece. Both cathodic and anodic vacuum arc deposition sources, CAVAD, are used to create a plasma vapor from solid materials composing the cathode and/or anode in the cathodic and/or anodic arc respectively. Gases, e.g., hydrogen or nitrogen can be in the deposited films by creating a background plasma of the desired gas using either RF energy, thermionic emission, or consequential ionization of the gas passing through the arc or around the substrate. Application of highly negative pulses to the substrate to extract the ions and provide them with the appropriate energy to interact with the other species in the thin film formation on the substrate to form the desired films. The substrate is bombarded with the ionized particles to form carbon nitrides with variable [N]/[C] ratios, referred to as $CN_x$.

42 Claims, 16 Drawing Sheets

METHOD FOR THE DEPOSITION AND MODIFICATION OF THIN FILMS USING A COMBINATION OF VACUUM ARCS AND PLASMA IMMERSION ION IMPLANTATION

This Application is a continuation-in-part application of U.S. Ser. No. 08/225,844 filed Apr. 11, 1994, now U.S. Pat. No. 5,441,624, continuation-in-part of U.S. application Ser. No. 07/934,925, filed Aug. 25, 1992, now U.S. Pat. No. 5,302,271.

FIELD OF THE INVENTION

This invention relates to vacuum based vacuum based arcs and plasma ion implantation, and more particularly to cathodic and anodic vacuum arcs and plasma immersion ion implantation methods for depositing films of carbon and carbon nitrides with variable [N]/[C] ratios.

BACKGROUND OF THE INVENTION

The deposition of material upon a substrate by the use of an electric arc is well known. FIG. 1 depicts a typical deposition apparatus 10. The process takes place in a vacuum chamber 12 which encloses a substrate 14 which is to be coated and an electric arc electrode assembly 16, having an anode 18 and a cathode 20. Material 24 to be deposited is placed in a receptacle 26 formed in the cathode 20 of the electric arc electrode assembly 16. The substrate 14 to be coated is placed near the electric arc electrode assembly 16. A potential is applied between the anode 18 and the cathode 20 of the electric arc electrode assembly 16 which are physically in contact and current flows between them, once the arc is ignited. As current flows between the cathode 20 and the anode 18, the material 24 to be deposited is vaporized and ionized forming a plasma 30 which maintains current flow even as the anode 18 and the cathode 20 are physically separated. The ions of the plasma 30 interact with the surface of the substrate 14 to be coated and are deposited thereupon. It should be noted, in the case where the cathode 20 is constructed from the material 24 to deposited, the cathode 20 need not contain a receptacle 24 and instead the cathode 20 itself is consumed in the deposition process. This form of deposition, in which material is deposited from the cathode region, may be termed cathodic vacuum arc deposition.

Alternatively, the anode 18 of the electric arc electrode assembly 16 may be used as the source of the material to be deposited. In such a case, where the material is deposited from the anode region, the deposition is referred to as anodic vacuum arc deposition.

In anodic vacuum arc deposition, an electric arc 30, which forms between the anode 18 and the cathode 20, is initiated by either electrical means or by physical contact between the anode 18 and cathode 20. Once the electric arc 30 forms or ignites, the anode 18 and the cathode 20 are separated and the arc is maintained by the material ionized from the anodic region during initiation. An example of anodic arc deposition may be seen in application Ser. No. 07/934,925, now U.S. Pat. No. 5,302,271, the whole of which is incorporated by reference herein. In conventional vacuum arc deposition systems, the quality and character of the material being deposited is highly variable. Anodic arcs produce mainly fine, neutral particles with only about 20% of the particles being ionized. Deposition of these fine neutral particles onto a substrate results in production of an excellent film having very fine granularity and a high optical quality. However, the molecular structure of the deposited material may not be adjusted to fit the needs of a particular application, such as for the production of diamond and carbon nitride coatings. The particles produced by an anodic arc do not have sufficient energy to affect the bond or crystalline structure of the deposited material.

Cathodic vacuum arcs, on the other hand, produce a much larger population of ionized particles (approximately 400% more) compared to anodic arcs. The particles produced by a cathodic vacuum arc include large macroparticles of material, neutral particles, and a population of ionized particles with different energy levels. Deposition of these particles results in a coarse coating of material forming on the substrate, due mainly to large fraction of larger macroparticles. Due to the macroparticles, the resulting coating of coarse material is not of optical grade as produced in an anodic arc. However, the larger fraction of ionized particles generated by a cathodic arc allows the substrate to be exposed to particles that, once accelerated to sufficient velocities, are capable of transmitting enough energy, through mechanical collisions, for altering the molecular structure of the film.

During cathodic arc deposition, the impinging ionized particles transfer their energy to the substrate film. The energy received from the impinging ions produces a variety of enhanced crystalline and bond structures within the deposited material, depending on the energy level of the impinging ionized particles. The resulting films produced by a cathodic arc possess a molecular structure that is harder and denser than those generated by an anodic arc. However, there is presently no method to select ions with a specific energy level from the population of ionized particles generated by the cathodic arc.

Hard carbon films with diamond-like bonding (Diamond-Like-Carbon, (DLC) films) are used as protective overcoats in many industrial applications such as a magnetic computer hard disk. DLC films also have a higher thermal conductivity than bulk diamond and have an excellent potential to provide an efficient heat sink. The most challenging problems in the coating of DLC films are the high stress in coated films and the adhesion of the films to the substrate. $CN_x$ films exhibit improved adhesion and a reduction in the interfacial tension between the films and substrate. Other processes, such as sputtering, produce $CN_x$ films. However, such films do not possess enhanced hardness or adhesion that are required in computer hard disk applications, jet turbines, heat sinks, etc.

SUMMARY OF THE INVENTION

An anodic vacuum arc deposition system is described herein for rapidly depositing a high quality, small grain size, coating on a substrate workpiece. The anodic vacuum arc deposition system includes a liquid anodic electrode which includes a continuous feed. The anodic vacuum arc deposition system includes an electric arc initiator and may be configured as a coaxial anode and cathode. A plurality of coaxial electrodes may used to deposition coat a large area and/or to sequentially deposit a series of layers each of a different material.

In one embodiment, a low current triggered anodic vacuum arc with a continuous wire feed mechanism provides the user with a self-contained high differential metal plasma spray. This apparatus provides coatings with properties similar to coatings from a basic anodic arc deposition source, but can be self-ignited, continuously run, and made highly mobile for greater coverage control.

An alternative embodiment of this device incorporates a cathodic arc source which supplies ions to both ignite the anodic arc and to enhance the ion population of the anodic arc metal flux for greater control over the deposition process via substrate biasing and magnetic focusing (hereinafter referred to as cathodic/anodic vacuum arc deposition or CAVAD). CAVAD combines the advantages of both a cathodic arc deposition system and an anodic arc deposition system to allow the user to more closely control the parameters and quality of the deposited material. This embodiment includes an anodic arc deposition apparatus that produces very fine, neutral particles of high quality. This embodiment also includes a cathodic arc deposition apparatus to produce highly ionized particles capable of modifying the bond structure of the deposited material. The cathodic arc deposition apparatus further includes a magnetic duct in conjunction with an adjustable ion accelerator that functions to eliminate the undesirable macroparticles that result in a coarse film as well as accelerate the ions to a specific energy for formation of more complex coatings, enhanced atomic bonding, and increased adhesion.

The anodic arc apparatus of the CAVAD system is located within the vacuum chamber and in front of the magnetic duct's exit port. Fine, neutral particles generated by the anodic arc apparatus are deposited on the substrate directly. The substrate or substrates are arranged on an electrically biasable and heat controlled substrate holder that is located out of the direct line-of-sight of the cathode of the anodic arc.

The cathodic arc source of the CAVAD system is located at one end of the magnetic duct. The magnetic duct provides for the removal of undesirable particles generated by the cathodic arc source. The magnetic field within the duct is adjustable so that the emission of the plasma may be maximized. The field from the magnetic duct confines the plasma emission from the cathodic arc allowing it to pass out the duct outlet with minimum current sink. The plasma emission contains both ions and electrons from the cathodic arc for which the ions contain the mass (material) to be deposited. Ions with a specific mass to charge ratio may selectively pass through the duct and impinge on the substrate surface. The magnetic duct is also constructed to eliminate other undesirable particles that result in a coarse grain film. Ions, neutral particles, and macro-particles generated by the cathodic arc flow into the magnetic duct where substantially all the neutral and macro-particles are removed. The resulting plasma stream consists almost entirely of highly ionized particles of a predefined energy that are capable of changing the structure of the deposited material. This plasma stream flows through the magnetic duct and into a vacuum chamber where the substrate is located.

The flow of selected ions from the magnetic duct impinges on the substrate. The ions, when sufficiently energized, alter the bond and crystalline structure of the material deposited from the anodic arc. The combination of particles generated by the two arc sources results in the deposition of a durable, high quality coating of predetermined molecular characteristics.

The CAVAD system has the advantages of both cathodic arc and anodic arc depositions, and the unique properties of dual segregated sources. Both vacuum arcs work independently, or may be combined to deposit the same or different materials. The CAVAD system allows for fast deposition of fine grain coatings from the anode source, and highly controlled ionized particles from the cathode source. Together, the two sources permit the deposition of a hard, dense, durable coating that is of high quality and fine grain. The invention also offers flexibility in choosing deposition composition and conditions. The flexibility and control of independent parameters by adjusting the cathodic/anodic vacuum arc deposition parameters enables various deposition coatings to be optimized.

Plasma Immersion Ion Implantation (PIII) is an effective technique in improving the surface properties such as hardness and reducing stress. The substrate is immersed in a plasma generated in a vacuum chamber and a train of negative high voltage pulses is applied to it. The plasma ions are attracted and accelerated toward the substrate. The plasma ions also diffuse into the substrate between the high voltage pulses via thermal diffusion.

In the present invention, carbon films with variable nitrogen content forming carbon nitrides, $CN_x$, using a combination of cathodic and anodic arcs with simultaneous plasma ion implantation have been produced. Both cathodic and anodic vacuum arc deposition sources, CAVAD, may be used to create a plasma vapor from the solid materials composing the cathode and/or anode in the cathodic and/or anodic arc respectively. The cathodic arc is operated either in a pulsed mode or triggered in the continuous mode. The cathodic and anodic arcs are operated separately or simultaneously. The choice and varying use of either source depends on the desired film composition and structure since the cathodic arc provides a highly ionized plasma flux while only about 20% of the anodic arc vapor is ionized. Further, thin films which include gaseous elements in their composition, such as hydrogen or nitrogen, can be formed by creating a background plasma of the desired gas using either RF energy, thermionic emission, or consequential ionization of the gas passing through the arc or around the substrate. Application of highly negative pulses to the substrate extract the ions from the surrounding plasma and provide them with the appropriate energy to interact with the other species in the thin film formation on the substrate to form the desired films. Using this method, carbon nitrides, $CN_x$, may be deposited on a substrate. Both cathodic (pulsed and continuous) and anodic arcs are used as sources of the carbon ion flux which interacts with the nitrogen ions from the background plasma in bombarding the substrate to form $CN_x$ with controllable nitrogen to carbon ratios, [N]/[C], depending on the operational conditions. As used herein, $CN_x$ refers to thin film carbon nitrides with variable nitrogen to carbon ratios, [N]/[C]. The phrase "highly ionized" is defined herein as approximately 80–100% ionization.

Carbon nitride films, $CN_x$, may be synthesized by combining vacuum arcs and plasma ion implantation techniques. Three methods were investigated: anodic arc with plasma ion implantation (AAPII); continuous cathodic vacuum arc with plasma ion implantation (CAPII); and pulsed cathodic vacuum arc with plasma ion implantation (PCAPII). The films are amorphous as analyzed by X-ray diffraction (XRD). X-ray photoelectron spectroscopy (XPS) and Raman spectroscopy analysis indicate the formation of C—N, C=N, and C—N bonds. Calculations of the surface tension components (dispersion and polar) of the films using the contact angle measurements technique indicate the formation of covalent carbon-nitrogen bonds. The $CN_x$ films exhibited enhanced adhesion as indicated by the work of adhesion calculations and a reduction in the interfacial tension by 49–62% between the films and substrate. Nanoindentation measurements show that the hardness of the $CN_x$ increased with increasing nitrogen content of the films. $CN_x$ films with [N]/[C] ratio of 0.135 exhibited hardness of approximately 20 GPa. Hardness values can be increased by optimizing the [N]/[C] ratio. The methods described herein regarding deposition of $CN_x$ films offer the advantages of easy reproducibility of high quality $C_x$ films and low set up and operational cost.

BRIEF DESCRIPTION OF THE DRAWINGS

Other benefits and features of the invention can be more clearly understood with reference to the specification and the accompanying drawing in which.

DESCRIPTION OF THE PREFERRED EMBODIMENTS

Figure 2:
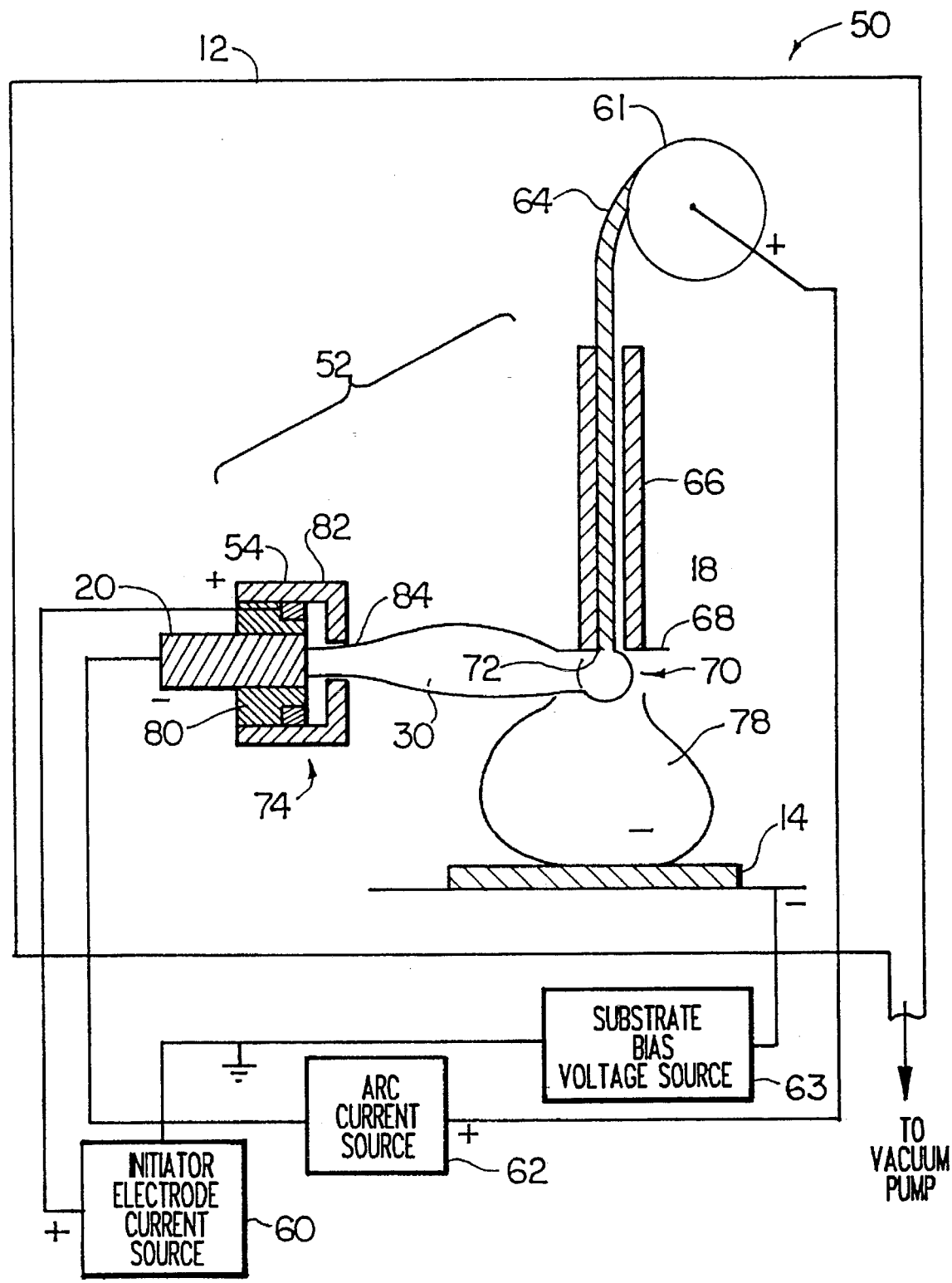
FIG. 2 depicts an embodiment of the anodic vacuum arc system of the invention.

Referring to FIG. 2, an embodiment 50 of the anodic vacuum arc system of the invention, in brief overview, includes a vacuum chamber 12 which encloses a substrate 14 to be coated and an electric arc electrode assembly 52, having an anode electrode 18, a cathode electrode 20 and an initiator electrode 54. In one embodiment the vacuum chamber 12 is maintained at $10^{-5}$ Torr. An initiator electrode current source 60 and an arc current source 62 provide the current necessary for initiating and sustaining, respectively, the electric arc 30. A substrate bias voltage source 63 provides a negative bias voltage to the substrate 14. The substrate bias voltage may be varied between 0 and −400 volts to provide an ion assist to the deposition material. The specific bias voltage used is determined by the specific substrate and the specific coating being deposited. Typically a high voltage provides the ion assist required for high adhesion. However, too high a bias voltage may result in ion implantation rather than surface coating and may result in the arc discharge shifting from between the anode 18 and the cathode 20, to between the anode 18 and the substrate 14.

Considering the electric arc electrode assembly 52 in more detail, and remembering that the values discussed are exemplary, the anode 18 of the electric arc electrode assembly 52 includes a spool 61 of anodic wire 64 which is 0.2 cm in diameter. The spool 61 is connected to the positive terminal of the arc current source 62 in such a way that current from the arc current source 62 is permitted to flow through the anodic wire 64. The non-spooled end of the anodic wire 64 passes through an insulating tube 66, which has an outer diameter of 0.5 cm, and which is terminated at one end by an insulating limiter 68. The insulating limiter 68 includes an aperture 72 through which current flows between the cathode 20 and the anode 18.

When the electric arc 30 forms, the anodic wire 64 melts, forming a ball 70 of molten material adjacent the insulating limiter 68. As the anodic wire 64 is vaporized and ionized, the spool 61 is rotated so as to feed the anodic wire 64 through the insulating tube 66 at the same rate as material is being vaporized and ionized from the ball 70 of molten material. This keeps the ball 70 of molten material adjacent the limiter 68 and constantly provides new liquid anodic material for deposition.

It is the liquefaction of the anode material that is the reason that the anode configuration is termed a liquid anode. An anode may be a liquid anode provided that the anode is small enough to permit the heat generated by the current to build up sufficiently to melt the anodic material. Additionally, the cathode 20, which is discussed below, must be large enough and/or be provided with cooling means such that the cathode material does not melt.

The size of the ball 70 of molten material is determined by the surface tension of the molten material, the degree to which the molten material will adhere to the anodic wire 64 and the temperature of the molten material. The first two properties are determined by the material to be deposited and hence the size of the ball 70 can be controlled by maintaining the current flow such that the material reaches its melting temperature but does not lose so much surface tension that the molten ball 70 drops from the anodic wire 64.

It should be noted that although the electrode assembly is shown oriented vertically, such need not be the case. It should also be noted that the spool 61 need not be placed within the vacuum chamber 12 as long as the anodic wire 64 is permitted to enter the vacuum chamber 12 without affecting the vacuum. The spool 61 may be rotated at the proper rate by means of a motor either under the control of a feedback loop or at a precalculated rate.

Figure 3:
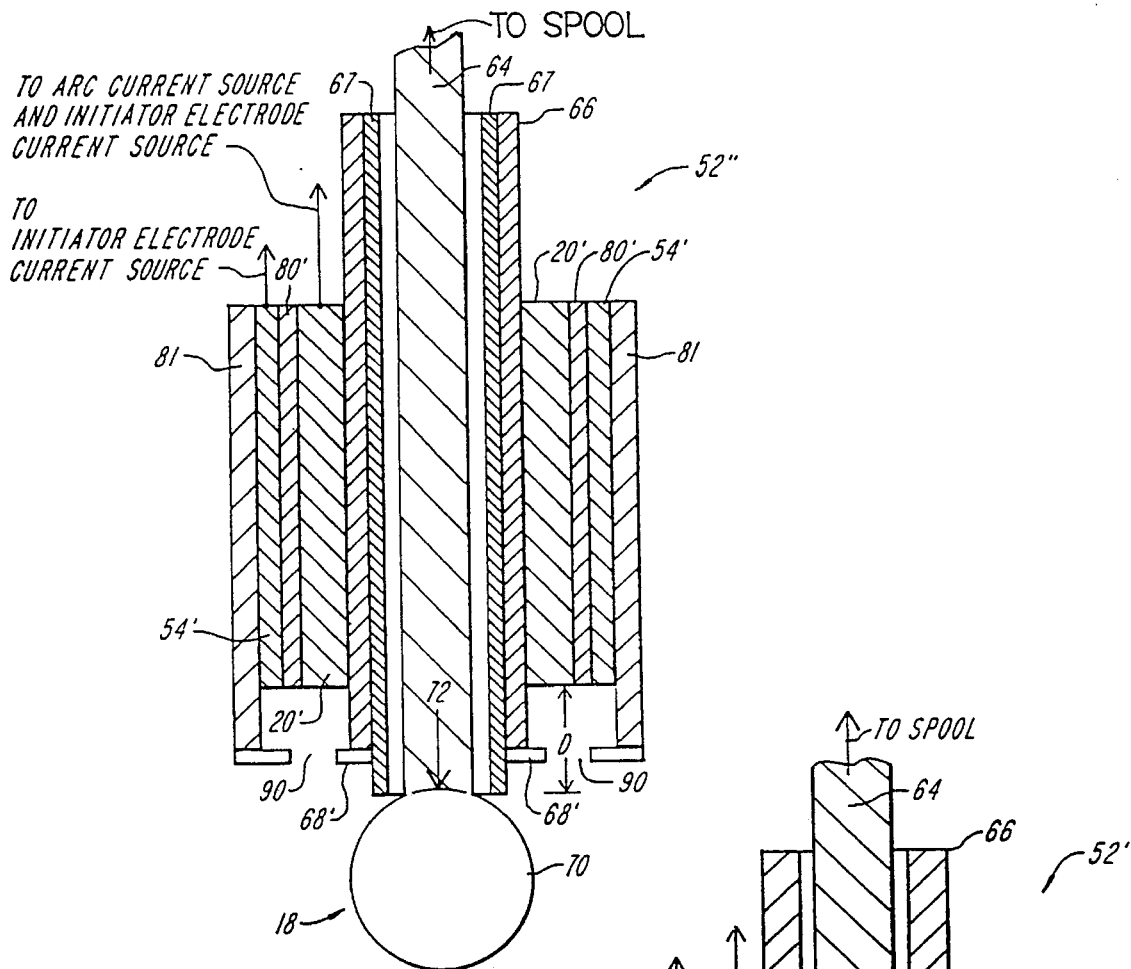
FIG. 3 is a cross-sectional diagram of another embodiment of a coaxial electrode assembly of the invention.

To deposit certain materials having a high melting temperature, such as tungsten or carbon, it may be necessary to provide an additional high temperature sink adjacent the insulating tube 66 to prevent the material of the insulating tube 66 from melting. FIG. 3 depicts an alternate embodiment of the anode assembly 52" in which a tube of tungsten 67 separates the insulating tube 66 from the molten material 70. The tungsten tube 67 is of a size sufficient to dissipate heat and thereby prevent the insulating tube 66 from melting.

The cathode portion 74 of the electric arc electrode assembly 52 includes a cylindrical cathode 20 having a diameter of 0.5 cm, which is electrically connected to the negative terminal of the arc current source 62 and which is electrically insulated from and encircled by an annular initiator electrode 54, which is 0.1 cm in thickness. The initiator electrode 54 is insulated from the cathode by 0.1 cm of insulation 80. The initiator electrode 54 is connected to the positive terminal of the initiator electrode current source 60. Both the initiator electrode 54 and the cathode 20 are partially enclosed by an insulating shield 82 having a shield aperture 84. The shield aperture 84 is oriented such that the electric arc 30 is permitted to form between the anode 18 and the cathode 20 while substantially preventing any material of the cathode 20, which may be vaporized by the arc, from reaching the substrate 14. In one embodiment the shield aperture 84 is 0.4 cm in diameter when the anode 18 and the cathode 20 are separated by about 2 cm. The shield 82 may be made of any high temperature-withstanding material such as ceramic or alternatively the shield may be made of a metal which is well insulated from the cathode 20 and the initiator electrode 54.

Material, vaporized and ionized from the anode 18, is drawn by the bias voltage applied to the substrate 14 by the substrate bias voltage source 63. The substrate 14 is separated from the ball 70 of molten material by about 20 cm.

Figure 4:
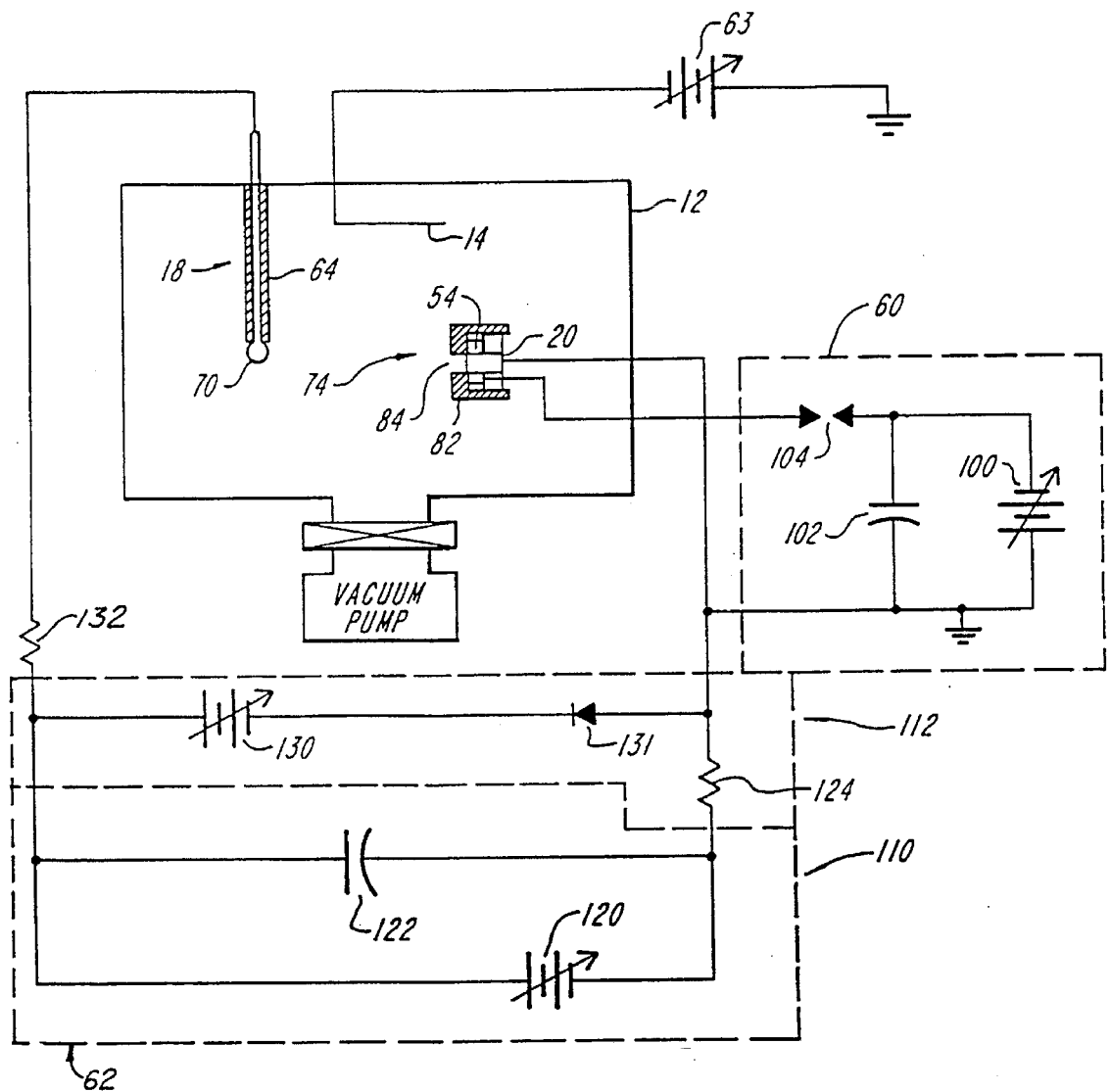
FIG. 4 is a schematic diagram of an embodiment of the external power circuits of the embodiment of the invention shown in FIG. 2.

FIG. 4 depicts the electronic components of the anodic vacuum arc system in more detail. The initiator electrode current source 60 includes a high voltage supply 100, a trigger capacitor 102 and a spark gap 104. The high voltage supply 100, producing 10K volts, charges the 0.1 μF trigger capacitor 102, which discharges across the 1 mm spark gap 104 and ionizes a path between the initiator electrode 54 and the cathode 20. The value of the trigger capacitor 152, the voltage supplied by the high voltage supply 100 and the size of the spark gap 104 may be varied as required.

The arc current source 62 includes an arc initiation portion 110 and an arc sustaining portion 112. The arc initiation portion 110 includes an arc initiation supply 120 and an arc initiation capacitor 122. The arc initiation capacitor 122, in one embodiment 2500 μF, is charged by the 200 V, 1A current limited arc initiation supply 120. When the trigger capacitor 102 of the initiator electrode current source 60 discharges, thereby forming a plasma between the initiator electrode 54 and the cathode 20, the resulting ions permit the arc initiation capacitor 122 to discharge between the anode 18 and the cathode 20 establishing a current path. Current flows between the anode 18 and cathode 20 through a 0.25Ω ballast resistor 132.

Figure 1:
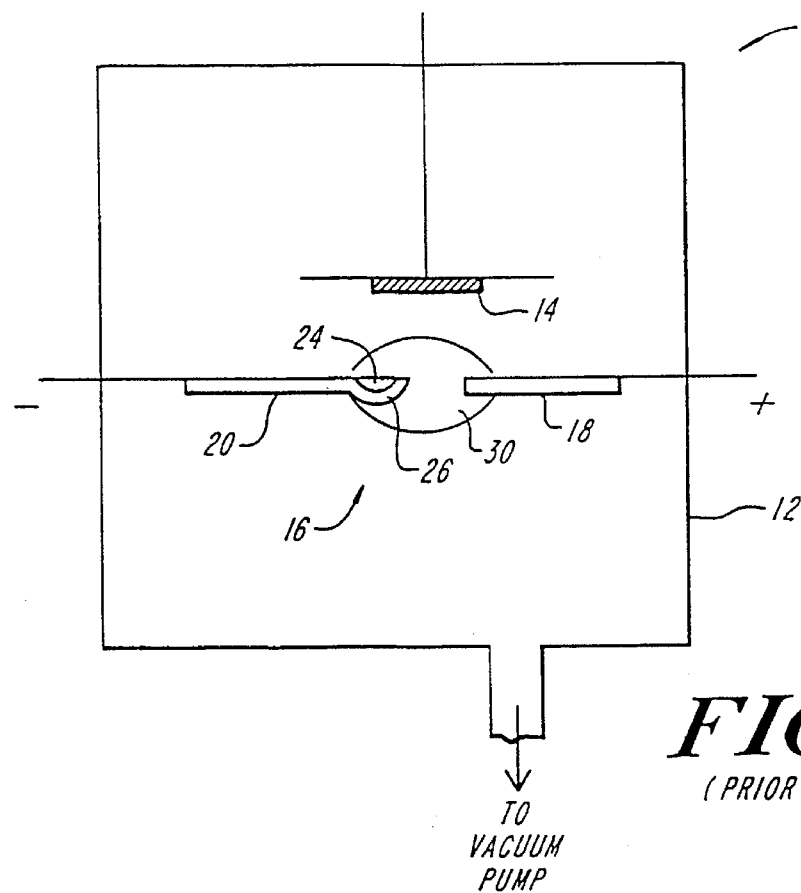
FIG. 1 depicts a cathodic vacuum arc system known to the prior art.
Figure 5:
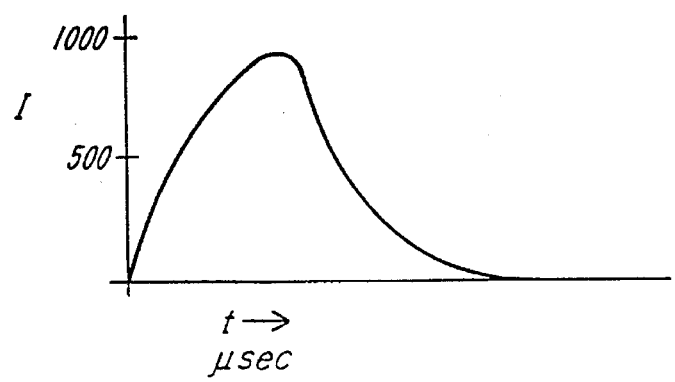
FIG. 5 is a graph of current through a resistor in the embodiment shown in FIG. 4 plotted against time.

FIG. 5 depicts the current versus time profile of the current through a 0.1Ω limiting resistor 124 which occurs as a result of the discharge of the initiation capacitor 122. Once the current path between the anode 18 and the cathode 20 is formed, the arc sustaining portion 112 of the arc current source 62 maintains current flow between the anode 18 and the cathode 20. The arc sustaining portion 112 includes a current limited arc current supply 130 and a diode 131. The current limited current supply 130 produces 100 A at 100 V.

Thus, to form the electric arc for deposition, the trigger capacitor 102 and the initiation capacitor 122 are charged by their respective power supplies. The trigger capacitor 102 discharges across the initiator electrode 54 and the cathode 20 forming an ionized path. The presence of ions permits the initiation capacitor 122 to discharge across the anode 18 and the cathode 20, forming an arc between the two. This arc is sustained by current supplied by the current limited arc current supply 130. The cycle in which initiation capacitor 122 and the trigger capacitor 102 are charged and discharged may be repeated until initiation of the electric arc occurs.

Figure 6:
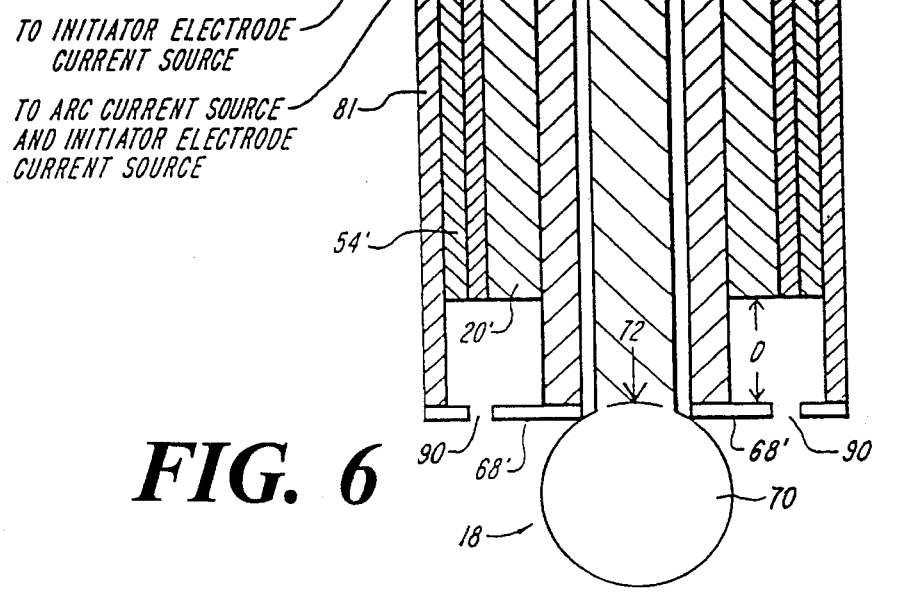
FIG. 6 is a cross-sectional diagram of an embodiment of a coaxial electrode assembly of the invention.

Although the anode 18 and the cathode 20 in the previous embodiment are depicted as separate units, such is not a requirement. An embodiment of a coaxial electrode assembly 52' in which an anode 18, a cathode 20', and an initiation electrode 54' are coaxially disposed is shown in FIG. 6. This coaxial electrode assembly 52' has at its center a 0.2 cm diameter anodic wire 64 movably positioned within a 0.5 cm outer diameter insulating tube 66 as in the previous embodiment.

An annular cathode 20' having an outer diameter of 0.7 cm is positioned concentrically about the insulating tube 66. An annular initiation electrode 54' having an outer diameter of 1.1 cm is in turn positioned concentrically about the cathode 20' and separated from the cathode 20' by an annular insulator 80' having an outer diameter of 0.9 cm. An insulator 81 having an outer diameter of 1.3 cm surrounds the coaxial electrode 52'. The cathode 20', the initiator electrode 54' and the insulator 80' are displaced from the end of the anode 62 at a distance (O), which in one embodiment is 0.3 cm. An insulating limiter 68', terminates one end of the coaxial electrode assembly 52'. The insulating limiter 68', includes a central aperture 72 for the anode 62 and an annular aperture 90 for the cathode 20'.

In this embodiment, as in the previous embodiment the trigger capacitor 102 discharges across the initiator electrode 54' and the cathode 20', permitting the initiation capacitor 122 to discharge across the anode 18 and the cathode 20' forming an electric arc. As the arc is sustained the anodic material melts forming a molten ball 70 from which the anodic metal vapor/plasma expands.

Figure 7:
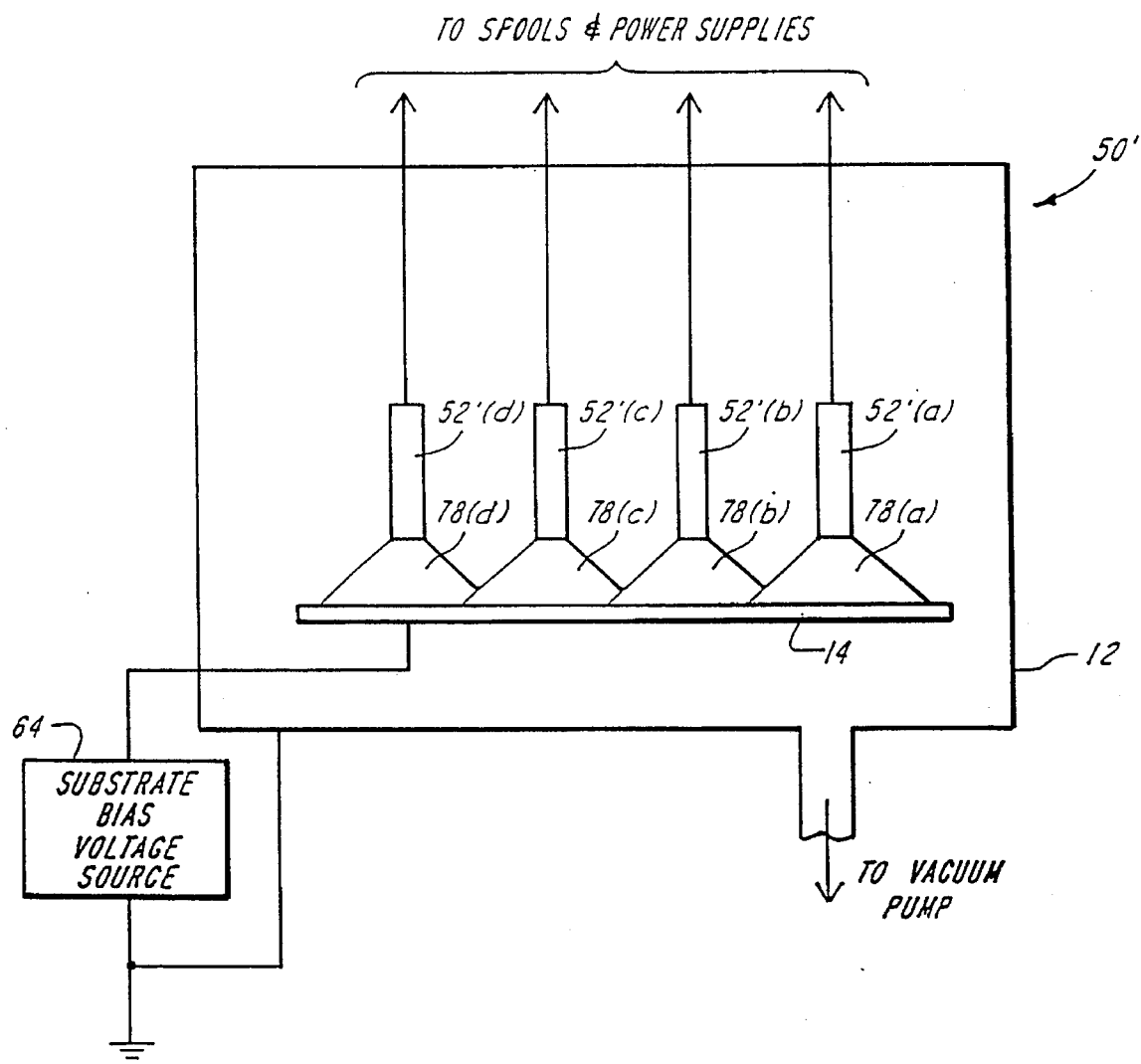
FIG. 7 is a highly schematic diagram depicting an embodiment of the invention utilizing a plurality of anodic vacuum arc electrodes.

One of the benefits of the coaxial electrode assembly 52' is that its small physical size permits several of the assemblies to be positioned adjacent one another. FIG. 7 depicts an arrangement of coaxial electrodes 52'(a)–52'(d) positioned adjacent a substrate 14 so as to provide increased area coverage. The coaxial electrode assemblies 52' are arranged such that the deposition vapor 78(a)–78(d) from each of the coaxial electrode assemblies 52' partially overlap. As in the previous embodiments each coaxial electrode assembly 52' has its own anodic wire spool (not shown). This arrangement provides a substantially uniform coating because the deposition profile is a cosine function with the highest deposition concentration directly beneath the coaxial electrode. Thus, the overlap of the deposition vapor from each electrode assembly 52' contributes to the uniformity of the coating.

In addition to providing increased area coverage, multiple coaxial electrode assemblies 52' may be used to sequentially deposit different layers of materials on a substrate. An embodiment of the invention which permits multiple layers to be deposited as well as permitting the deposition coating of both sides of the substrate is shown in cutaway perspective in FIG. 8. In this embodiment the substrate to be coated is shown as a web substrate 14' which is played off a first reel 101 and taken up on a second reel 103. Although the reels 101, 103 are depicted as being located within a vacuum chamber 12, this need not be the case as long as the vacuum of the vacuum chamber is maintained. The reels 101, 103 are separated and are driven in such a way to permit the substrate 14' to move (arrow m) from one reel 101 to the other 103 while passing adjacent a plurality of coaxial electrodes 52'. Again each coaxial electrode is attached to its own anodic spool (not shown).

In the embodiment shown the coaxial electrodes grouped together along the width of the chamber, the x-axis, for example 52'(*a*), 52'(*b*), 52'(*c*), are all depositing the same material and are arranged so as to provide the width of coverage required by the width of the substrate 14'. The different groups of coaxial electrodes located along the length of the chamber, the y-axis, each deposits a different material onto the substrate 14'. Thus, for example, the first group of coaxial electrodes 52'(*a*), 52'(*b*), 52'(*c*), would first deposit a layer of aluminum 111 on the substrate 14' as the substrate 14' passes below the coaxial electrodes 52'(*a*), 52'(*b*), 52'(*c*). Then the second group of coaxial electrodes 52'(*d*), 52'(*e*), 52'(*f*) would deposit a second material 113 such as copper upon the layer of aluminum 111 just deposited on the substrate 14'. In addition, other coaxial electrodes, for example 52'(*g*), 52'(*h*), can be used to simultaneously deposit layers of material 114 on the other surface of the substrate 14'.

Figure 9:
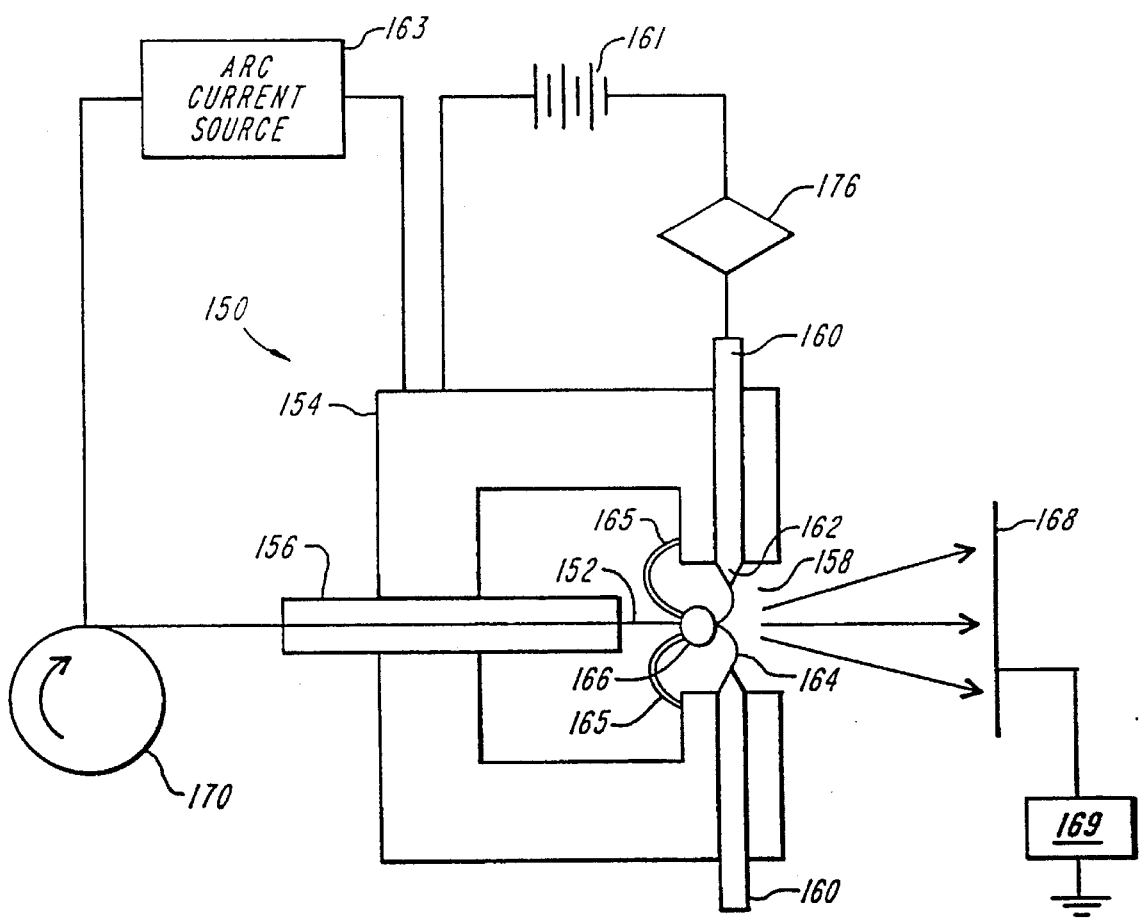
FIG. 9 is a schematic diagram of the triggered low current vacuum arc.

In an illustrative embodiment depicted in FIG. 9, a triggered low current anodic vacuum arc assembly 150 includes a continuous feed anode 152 fed from a spool 170, and a high voltage cathode 154 which also acts as a triggering mechanism. The continuous feed anode 152 is typically a wire that may be fed from the spool 170 through an insulator 156 mounted in the high-voltage cathode 154, as described in U.S. Pat. No. 5,302,271. Preferably, the insulator 156 is made of ceramic, however other high temperature insulative materials such as boron nitride or alumina may also be used.

Mounted to the aperture 158 of the cathode is a ceramic insulator 160 housing an anode trigger 162 shown in side view in FIG. 9. The ceramic insulator functions to insulate the trigger 162 from the cathode 154 and to prevent discharge of ignition electricity between the trigger and the cathode during triggering. The cathode 154 and the anode trigger 162 are connected to a high voltage power supply 161 and associated protection circuits 176 to provide power to trigger the anodic arc. Protection circuits, shown generally as 176 and described in more detail below, include spark gaps, inductors, metal oxide varistors (MOVs) and the like, and prevent arcing back through the anodic arc power supply 161.

A high voltage from a high voltage power supply 161 is applied through the ceramic insulator 160 to the anode trigger 162 to provide an ignition source 164, such as a spark. Typically, voltages in the range of 5 kV to 15 kV are suitable to initiate a cathodic arc that transitions into an anodic arc. Alternatively, a high voltage spark gap between the cathode 154 and the anode 152 of the anodic arc assembly 150 may also be used as an ignition source. The arc voltage for the latter can be up to 20 kV depending on base pressure ($10^{-4}$ to $10^{-6}$ Torr) and working gas, Ar or $N_2$, if used for compound coatings such as carbon nitride.

The ignition source 164 permits an anodic arc 165 to be formed between the wire anode 152 and the cathode 154. An arc current source 163, connected between the spooled wire 170 and the cathode 154, sustains the arc during deposition operations. The anodic arc 165 heats the anode 152 to a temperature of sufficient to liquify a portion of the anode so as to form a ball of molten metal 166 at the end of the anode 152. Vaporized metal from the ball of molten metal 166 is sprayed through an aperture 158 and onto a target or substrate 168. The feed speed of the anode 152 from the spool 170 is correlated with the rate of vaporization of the anodic material such that a substantially constant volume of molten material is present. If the target 168 is made from a conductive material, a power supply 169 may be connected to the target 168 to provide it with an electrical charge to improve coating efficiency and adherence by both accelerating to a higher energy and attracting the ionized particles to the substrate. A conductive substrate holder also assists in removal of radiant heat transmitted to the substrate and consequent coating, and enables conduction of an applied electric field. Typically, the power supply 169 provides voltages in the range of zero to 350 volts. Alternatively, if the target 168 is made from an insulative material, such as glass, plastic, silicon, and the like, an RF bias may be used.

Figure 10:
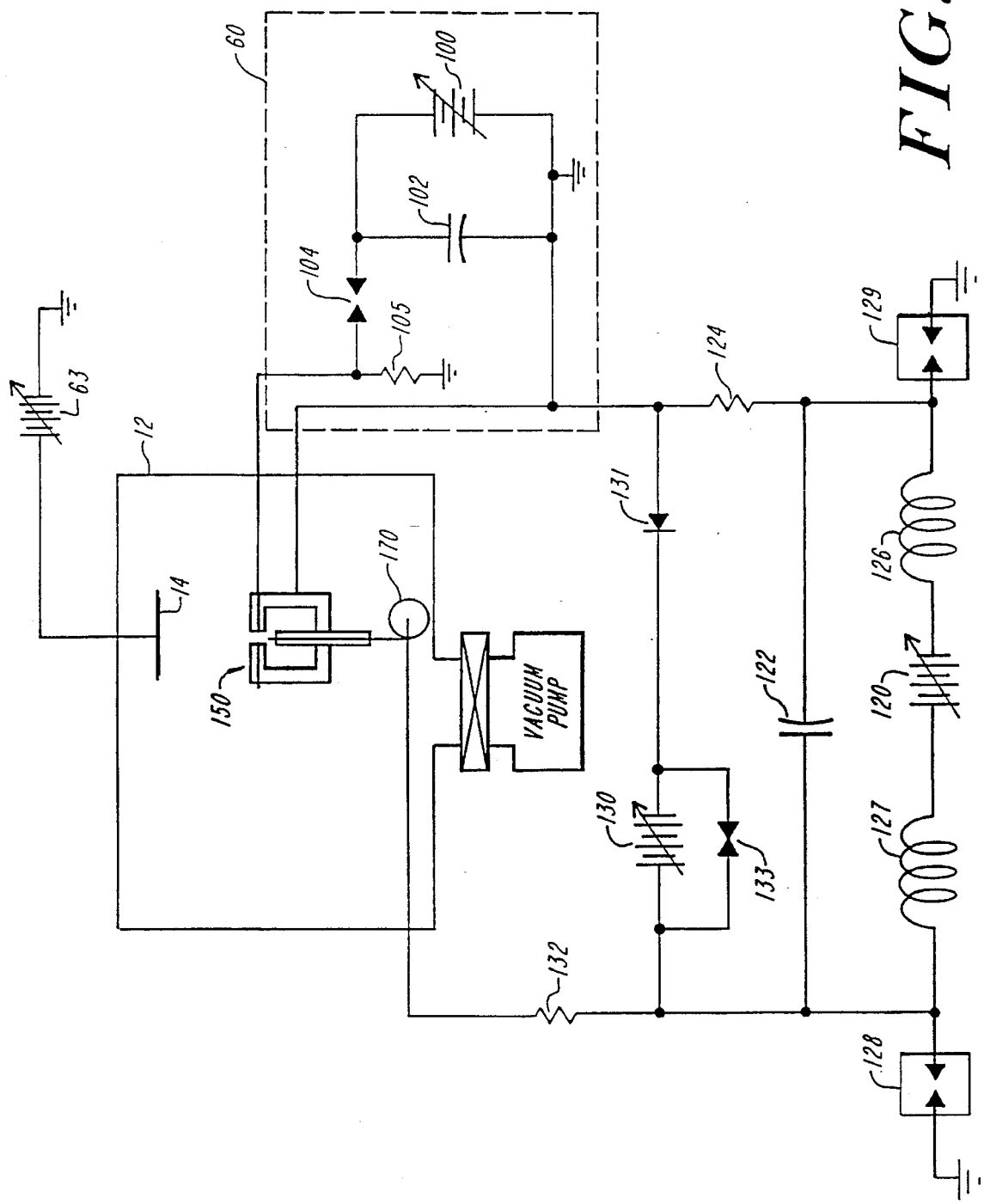
FIG. 10 is a schematic diagram of an embodiment of the external power circuits of the embodiment of the invention shown in FIG. 9.
Figure 11:
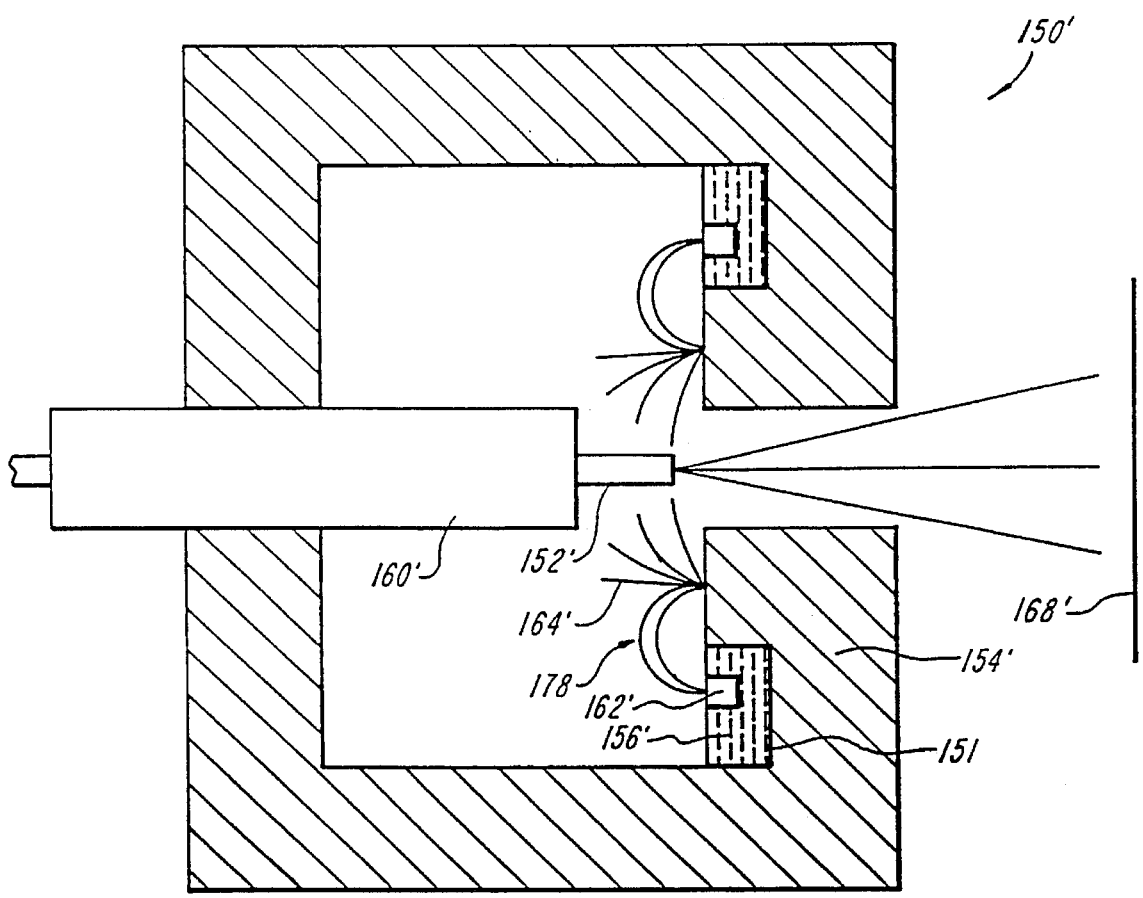
FIG. 11 is a schematic diagram of an alternative embodiment of the triggered low current vacuum arc.

The high voltage trigger circuit used to initiate and maintain the arc is shown in FIG. 10. This circuit is similar to FIG. 4, but includes several safety precautions. The metal oxide varistor (MOV) 133 is used to shunt current when a high voltage (>200 volts) is detected across the main anodic arc power supply 130 to prevent voltage spikes from damaging the unit. The inductors 126 and 127 are used to limit the converted current spikes by acting as a low-pass filter in the lines to power supplies 120 and 130. The spark gaps 128 and 129 are used to discharge voltages exceeding the voltage rating of capacitor 122 and any large sporadic power spikes from the arc ignition discharge in the chamber. The spark initiating circuit 60 includes a spark gap 104 that discharges the stored energy of capacitor 102 into the trigger/cathode section of the anodic arc to ground. The placement of a high resistance resistor 105 reduces the breakdown voltage required to initiate the arc discharge. This is desirable for operational safety, reliability, and higher component integrity.

Figure 8:
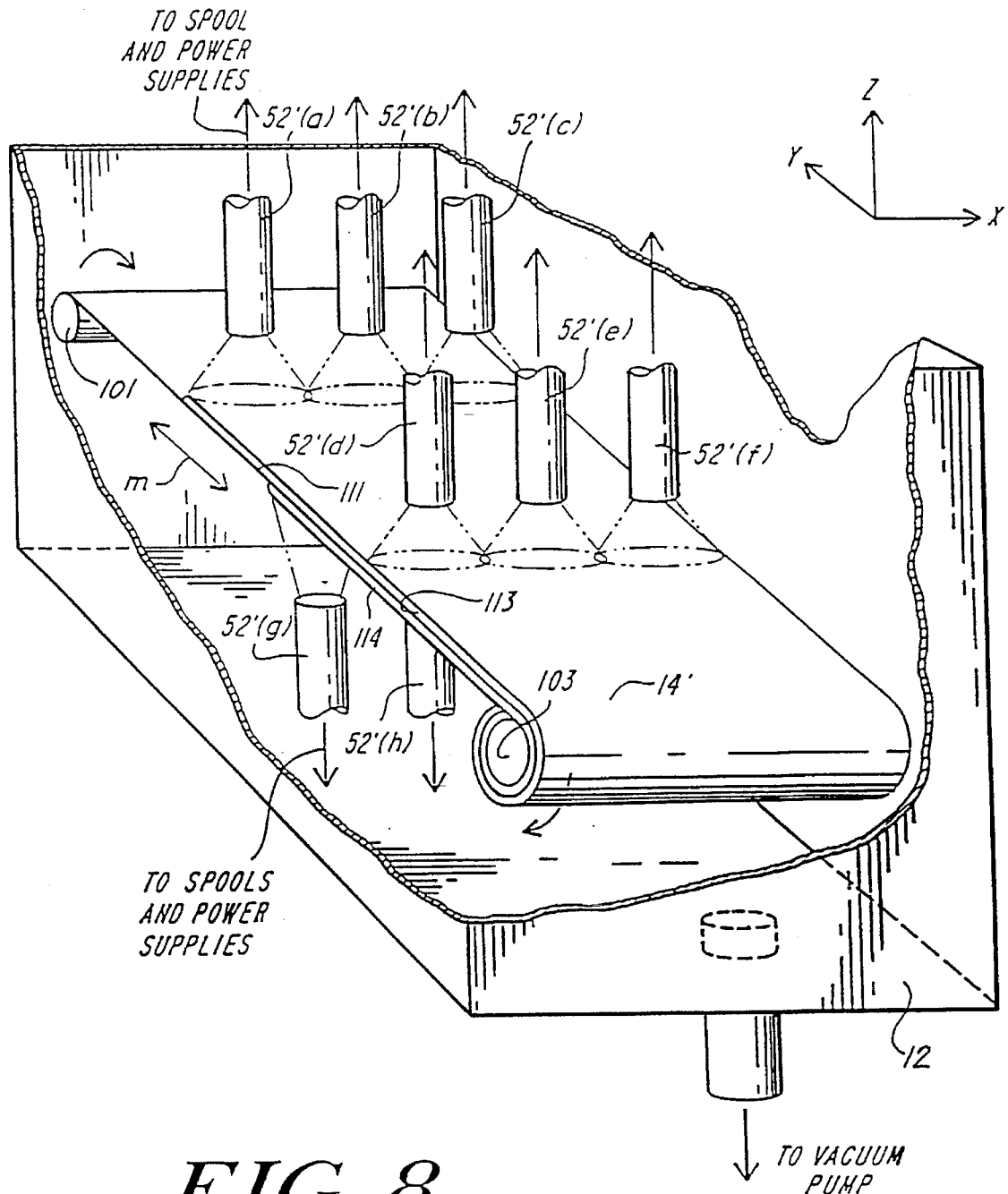
FIG. 8 is a perspective diagram depicting an embodiment of the invention utilizing a plurality of anodic vacuum arc electrodes for depositing a plurality of layers on a webbing substrate.

An alternative embodiment of the triggered low current anodic vacuum arc assembly 150' is illustrated in FIG. 8 and includes a continuous feed anode 152' mounted in an insulator 160', a cathode 154', and anode trigger 162' mounted in a insulator 156' made from a high temperature resistant, insulative material such as alumina or boron nitride. The insulator 156' is located in a channel 151 open to the interior of the cathode 154' and adjacent to the cathode aperture 158'. Although the trigger 162' is illustrated as flush-mounted, other configurations possible.

Application of a high voltage in the range of approximately 5 kV to 15 kV to the anode trigger 162' ignites a cathodic arc 178 between the anode trigger 162' and the cathode 154'. The cathodic arc 178, in turn, initiates an anodic arc 164' between the cathode 154' and the continuous feed anode 152'. The anodic arc 164' permits the anode material to be vaporized and deposited on a target 168'.

In an illustrative embodiment, a copper wire of approximately 0.40 inch was used as the anode. The resulting evaporation rate was approximately 0.05 g/min/A. The ignition process requires a voltage discharge on the order of approximately 5 kV to sufficiently allow the main discharge of the anodic arc to start. The initial ignition arc exists for less than a second and continues until the anodic arc is formed. The ignition process can take as short as ⅙th of a second to provide enough plasma flux to sustain a continuous anodic arc ignition.

Figure 12:
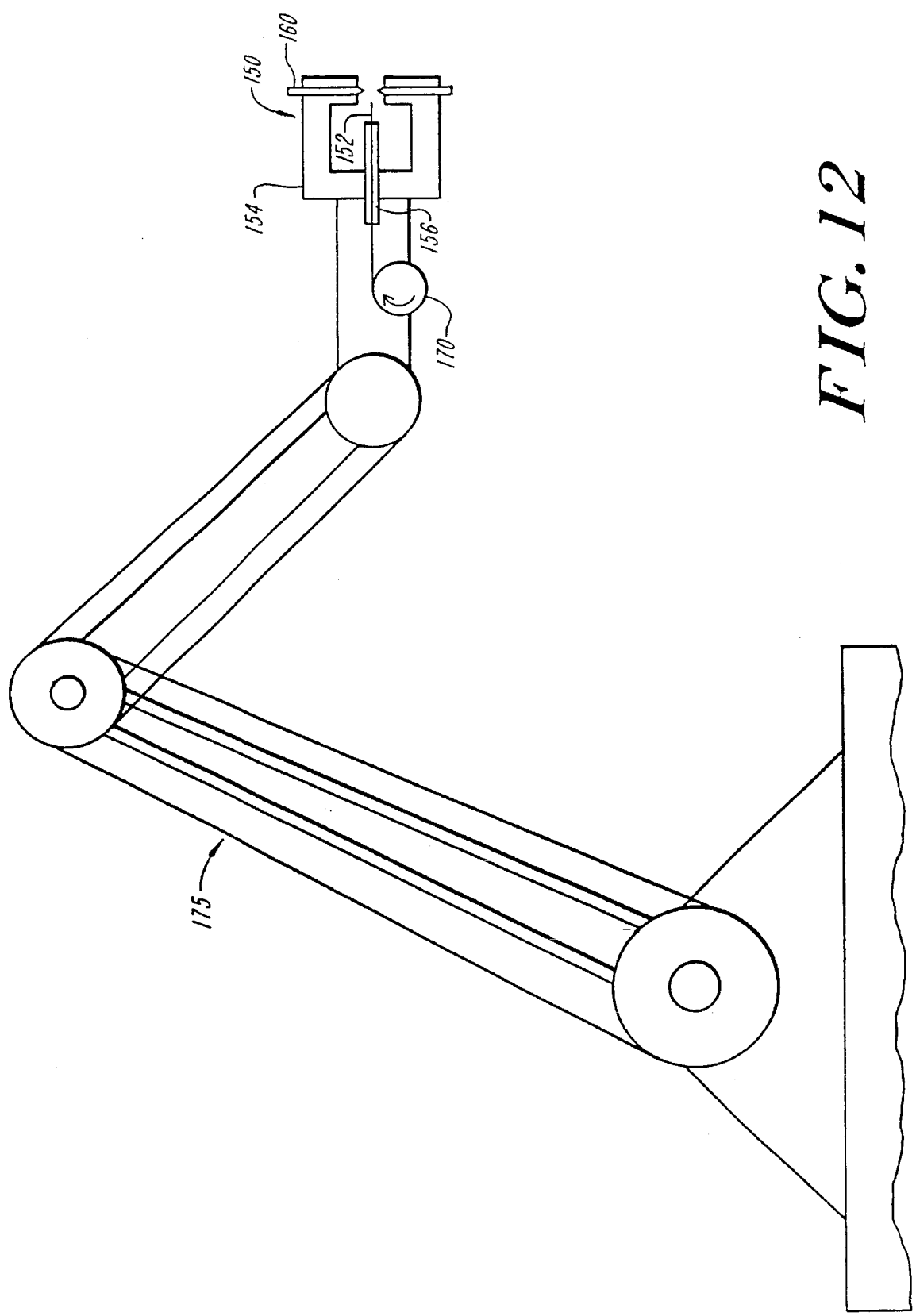
FIG. 12 is a schematic diagram of the triggered low current vacuum arc mounted on a robotic arm.

As illustrated in FIG. 12, the triggered low current anodic vacuum arc assembly 150 may be attached to the end of a robotic arm 175. The range of motions of the robotic arm 175 allow the triggered low current anodic vacuum arc assembly 150 to be positioned at any point in space. The robotic arm 175 may be computer-controlled to permit precise positioning of the triggered low current anodic vacuum arc assembly 150. The ability to precisely position the triggered low current anodic vacuum arc assembly 150 permits the user to direct a uniform spray of vaporized metal onto a complex target surface, such as concave or ellipsoidal. In addition, computer control of the robotic arm 175 allows the user to regulate the speed of the arm, thereby controlling the thickness of the deposited metal spray. This arrangement may be ideal for space-based applications such as the planned space station.

Figure 13:
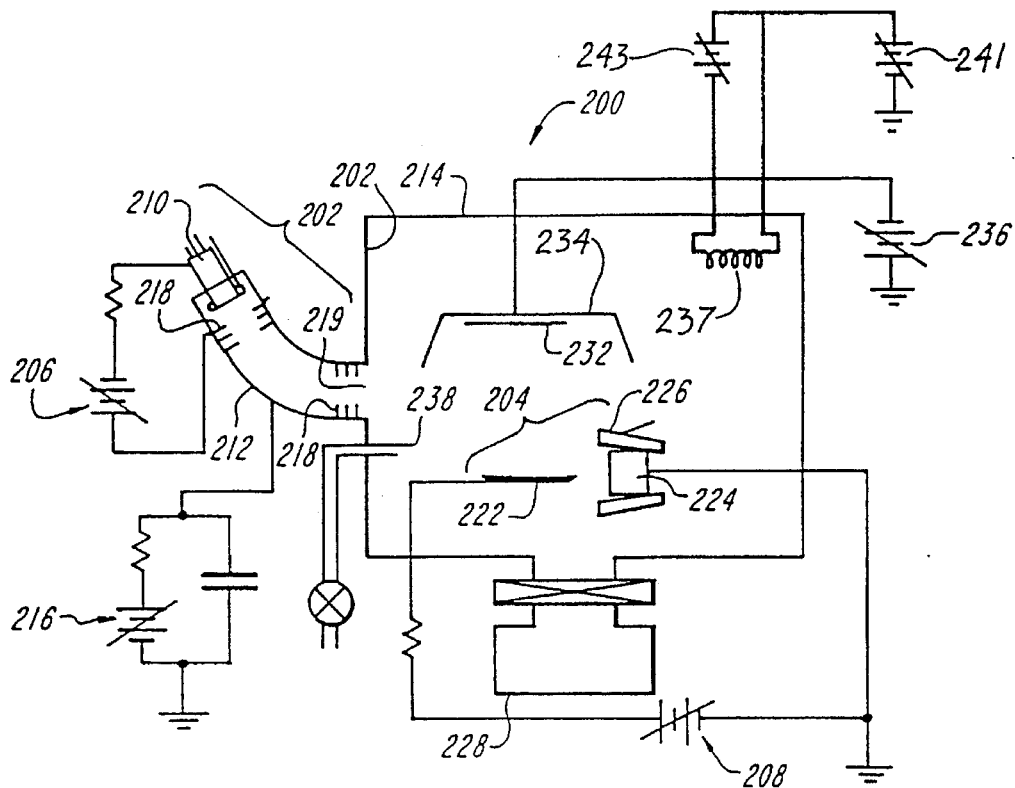
FIG. 13 is a schematic diagram of the cathodic/anodic vacuum arc deposition system of the present invention.

A schematic diagram of an embodiment of a cathodic/anodic arc deposition apparatus 200 is illustrated in FIG. 13. In overview, the apparatus includes a cathodic arc ion source 202, an anodic arc source 204, a main vacuum chamber 214, and a vacuum pump 228. The anodic arc source 204 is positioned inside the main vacuum chamber 214, while the cathodic arc ion source 202 is positioned outside the main vacuum chamber 214 at the end of a magnetic duct 212. The cathodic arc ion source 202 and the anodic arc source 204 are each powered independently by a cathodic arc power source 206, and an anodic arc power source 208, respectively. Independent control of each power source permits the parameters of each arc source to be adjusted individually according to the requirements of each deposition.

The cathodic arc ion source 202 includes an ion generator 210 located at one end of a magnetic duct 212. Ions generated by the ion generator 210 flow through the curved magnetic duct 212 and into the main vacuum chamber 214. The magnetic duct 212 includes an electromagnet connected to a duct power source 216. The magnetic duct 212 will be discussed in more detail below. The electromagnet establishes a solenoidal magnetic field inside the curved duct 212.

The solenoidal magnetic field inside the curved duct 212 permits selection of ions of a predetermined energy level by allowing ions possessing predefined energy parameters to pass through the curved duct 212. The magnetic field established within the curved duct 212 also permits a higher concentration of plasma out the exit 219 of the duct. The ions from the plasma are segregated at the duct exit by an electric field bias and are accelerated by biasing the substrate relative to the cathode thereby energizing the ions to an energy level of interest. In addition, the magnetic field confines the plasma and permits the generation of multiply ionized species. The magnetic field is proportional to the ion emission efficiency. The higher the field, the higher the probability of doubly and triply ionized source material included in the general ion emission. Neutral particles generated by the ion generator 210 strike the wall of the curved duct 212 and are thereby prevented from entering the main vacuum chamber 214. Baffles 218 at each end of the curved duct 212 in combination with the curvature of the duct also remove unwanted macroparticles.

The ions generated by the ion generator 210 flow through the curved duct 212 and into the main vacuum chamber 214 which is held at approximately $10^{-5}$ Torr by a vacuum pump 228. The wall of the main vacuum chamber 214 to which the curved duct 212 is attached is covered with a material of high magnetic permitivity 220, such as mu-metal, iron, or steel to prevent the magnetic field from leaking out of the magnetic duct 212 and interfering with the anodic arc source 204. The resulting plasma stream flowing from the curved duct 212 consists almost entirely of highly ionized particles of a predefined energy that are capable of changing the structure of the material deposited onto the substrate 232. The vacuum chamber 214 includes a coil 237 or other device to supply energy to ionize a working gas contained within the vacuum chamber 214. Coil 237 is connected to a biased power supply 241 and a current power supply 243. The biased power supply 241 biases the coil to repel the electrons away from the chamber wall and to provide high enough energy to ionize the working gas. Current power supply 243 provides current to the coil 237 to emit electrons which, in turn, convert the working gas into a plasma.

Figure 14:
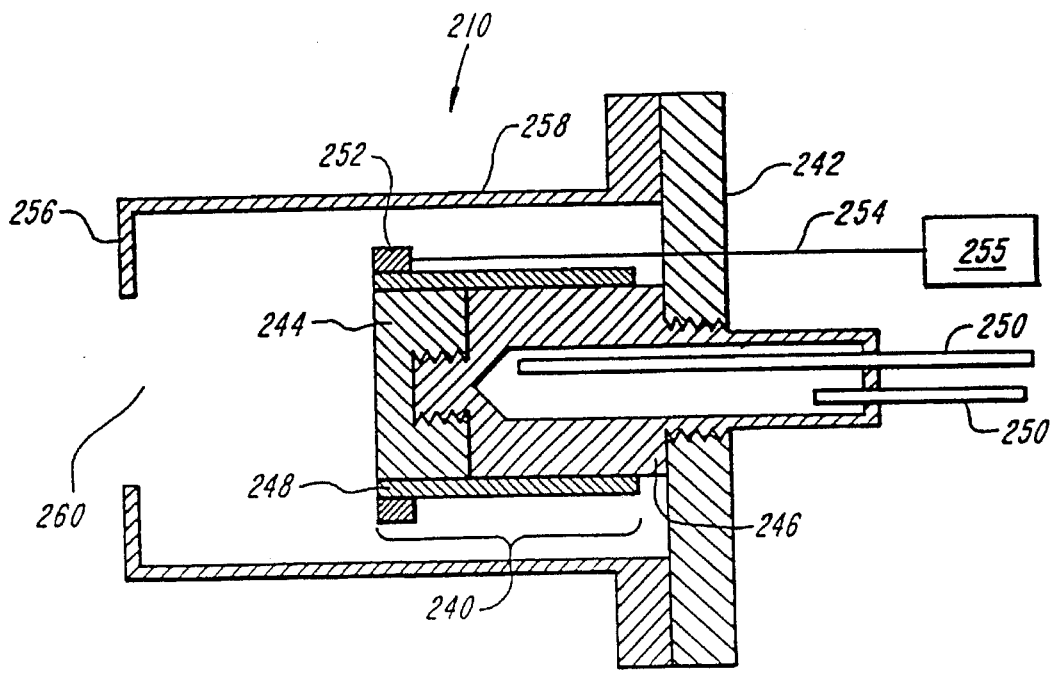
FIG. 14 is a cross-sectional view of the cathodic arc ion source of the present invention.

Considering the ion generator 210 and magnetic duct 212 in more detail, and referring now to FIG. 14, the ion generator 210 of the cathodic arc ion source 202 includes a cathode assembly 240 mounted on a base 242. The cathode assembly 240 includes a plug of material to be ionized 244, such as Cr, Al, Ti, and the like, and a cathode base 246 surrounded by an insulator tube 248. The cathode base 246 may be cooled with water supplied by water supply tubes 250 in order to ensure that the cathode assembly 240 does not overheat. The insulator tube 248 is surrounded by an annular trigger 252 connected by a wire 254 to a trigger device 255.

In one embodiment, the front end 256 of the anode 258 is located approximately 5 cm from the cathode assembly 240 and has about a 2 cm diameter hole 260 through which the plasma flows. The cathodic arc ion source 202 is initiated by introducing a high voltage pulse on the trigger 252. The high voltage pulse causes a surface breakdown between the trigger 252 and the cathode assembly 240, creating one or more cathode spots (not shown) whose ionized particles trigger the main cathodic arc discharge.

Figure 15:
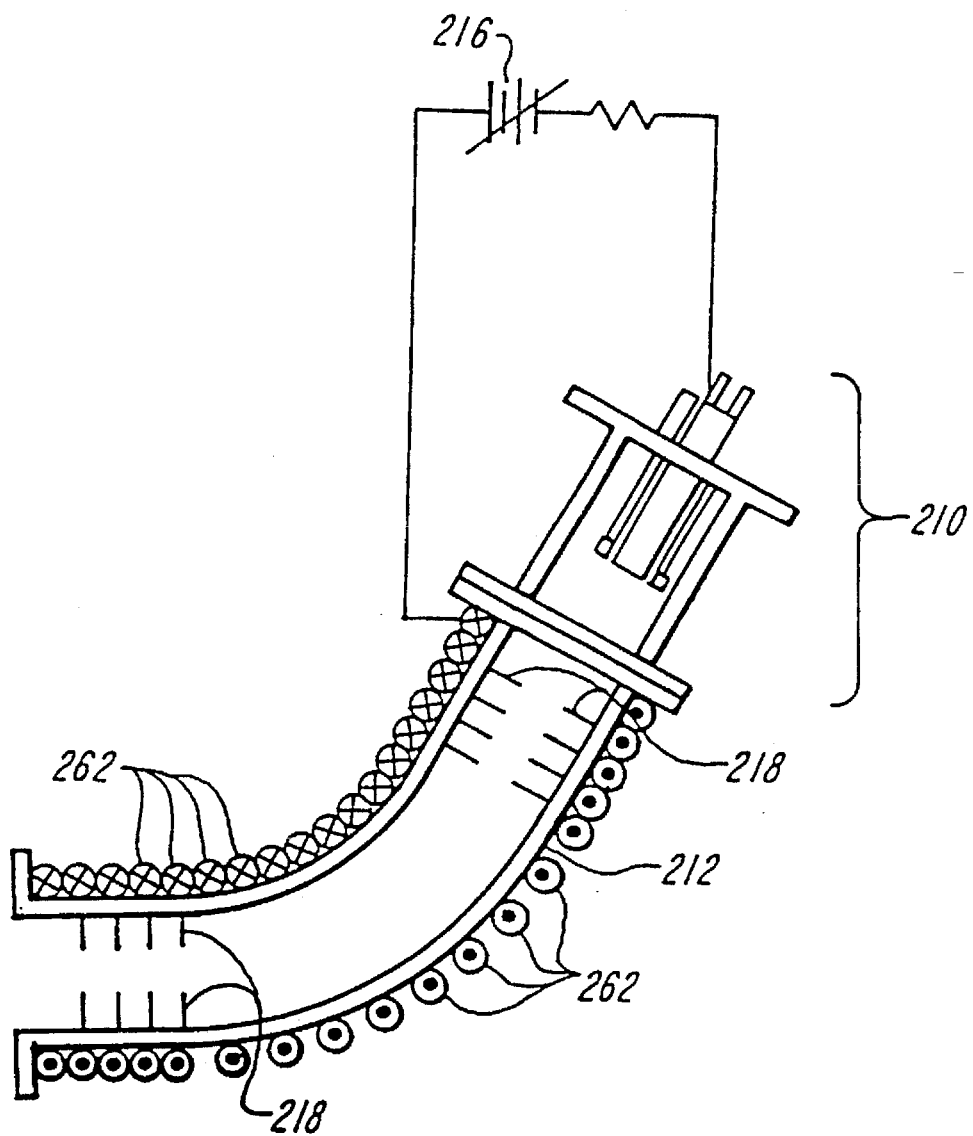
FIG. 15 is a cross-sectional view of the cathodic ion source and the magnetic duct of the present invention.

Referring now to FIG. 15, in one embodiment, the magnetic duct 212 is made of a 5 cm diameter copper pipe with a 60° arc located in the middle of the duct. The axial magnetic field is generated by approximately 200 turns of copper tubing 262 wound around the duct. Setting the current on the duct power source 216 to approximately 95 amperes corresponds to a magnetic field strength of approximately 350 Gauss in the center of the duct 212 and approximately 200 Gauss close to the ends of the duct. The magnetic field within the duct is substantially axially uniform, with the center of the axis having the largest field strength and the field strength falling off rapidly near the edges. As ions are produced by the ion generator 210, they are guided by the magnetic field and follow the bend in the duct, while neutral atoms and macroparticles will hit the walls of the duct or baffles 218 and be removed from the ion stream. Adjustments to the substrate bias power source 236 permits the user to establish various acceleration energies of the ions thereby providing the desired ion energies to the substrate 232. Adjusting the energy of the particles is an important control parameter in alterations of the bond and crystalline structure of the material deposited, as well as the depth of penetration of the particles. As a result, a very highly ionized plasma of defined energy flows into the main vacuum chamber 214. The percentage of ions in the vapor and the energy of the ions are crucial for good adhesion to the substrate, and adjustments to both the cathodic and anodic sources will enable an optimization for different film deposition requirements.

The anodic arc source 204 is positioned inside the main vacuum chamber 214 and in front of the exit of the magnetic duct 230. The anodic arc source 204 includes an anode 222, a cathode 224, and a ceramic shield 226. The anode 222 is made of material to be deposited, such as Al, Ti, Si, and the like, and the cathode 224 is made of a high density graphite. An arc is initiated by physically touching the anode 222 to the cathode 224 and then pulling the electrodes apart. Alternatively, electronic ignition may be used as discussed previously. After ignition, the anodic arc source 204 can run at currents from approximately 20 to 100 A.

The material generated from the anodic ion source 204 is deposited onto a substrate 232 mounted on an adjustable target 234 inside the main vacuum chamber 214. The target 234 and substrate 232 are connected to a power source 236 that permits the substrate 232 to be electrically charged and heat controlled. The power source 236 may be either continuous or pulsing and may apply a voltage to the substrate 232 from approximately −50 to approximately −2000 volts. Higher voltages, e.g., −1000 to −2000 volts, are used primarily to accelerate the background ions for implantation. However, these higher voltages may also add energy to the carbon ion flux. Electrical biasing of the target 234 and substrate 232 by the power source 236 permits the ions generated by the anodic arc source 204 and the cathodic arc ion source 202 to be attracted to the substrate 232, and results in a more uniform deposition of material.

In one embodiment, a negative charge on the substrate 232 allows positively charged particles from the anodic arc source 204 and cathodic arc ion source 202 to be attracted to the substrate 232. The power source 236 is controllable and permits the operator to choose the degree of electrical biasing of the substrate 232. Choice of an electrical bias of the substrate 232 depends on the material being deposited and the degree of ionization of the particles produced by the individual arcs. The electrical attraction of the particles to the substrate 232 results in more uniform deposition of material and selection of particles with predetermined energies, formation of compounds, and the enhancement of material adhesion to the substrate.

The substrate 232 and target 234 are located out of the direct line-of-sight of the cathode 224 of the anodic arc source 204 to eliminate any macroparticles generated by the anodic arc source 204. A shutter may be used to further prevent the deposition of macroparticles during the arc initiation stage. The material deposited by the anodic arc source 204 consists of high quality, fine particles that result in an excellent film having very fine granularity and high optical quality.

The combination of a high degree of particle ionization with a negatively charged substrate results in good adhesion of coatings deposited onto the substrate. Ions from the cathodic arc ion source 202 serve two major purposes in enhancing adhesion of material to the substrate. First, the impinging ionized particles transmit their kinetic energy thereby compacting the previously deposited atoms into a tighter and denser configuration with the host material. Second, the highly ionized particles permit the bond of the deposited material to be reinforced or otherwise altered (e.g., amorphous bonding to crystalline bonding) to achieve the specific requirements of the intended application. The magnetic field formed in the magnetic duct 212 is adjustable so that the user may optimize the throughput of the plasma reaching the duct exit. The ions exiting the magnetic duct may be accelerated towards the substrate at a predetermined kinetic energy for chemical reactions, bonding, or other physical alterations of the deposited material. An adjustable electric field permits the user to choose the depth of surface layer penetration of the impinging ions. In addition, contamination of the ion stream is greatly reduced by the magnetic duct 212 and baffles 218. Removal of macro- and neutral particles from the ion stream results in a coating with higher purity and fewer imperfections.

The disclosed CAVAD deposition system has the advantages of both cathodic arc and anodic arc depositions. CAVAD provides the fine granularity and high deposition rate of material deposited by an anodic arc, while also permitting the crystalline structure and bonding of the deposited material to be enhanced by bombardment with ions generated by a cathodic arc. Deposition composition and conditions may be chosen by the user to suit particular material deposition requirements.

Because the cathodic arc and the anodic arc operate independently, both the partial pressure of the ions and the vapor, and the energy of different ions can be adjusted separately. Gas, such as $N_2$ or $H_2$ can be added for the deposition of compounds and/or for catalytic purposes. Gas can also be introduced into the cathodic arc where it becomes highly ionized so as to provide another means for depositing complex coatings such as aluminum nitride where the aluminum can be from both the anodic arc source and the cathodic arc ion source, but the nitrogen is then ionized with the arc plasmas and sourced into the coatings as it is injected as background gas. Other applications include formation of carbon nitride and titanium nitride films.

The invention offers a high rate of deposition of material due to the high evaporation rate of both vacuum arcs. Typical deposition rate ranges from 1 to 6 μm/min for each arc separately. In addition, operating costs are low due to the high efficiency and ease of control. Electrical costs are approximately ⅓ of those compared to thermal evaporating systems.

The coatings prepared by CAVAD possess a density very close to that of the original source or the desired compound, e.g., natural diamond. For the anodic arc, resistivity of the coating approached that of the bulk material within less than 10%. Matching resisitivities are a good indicator for similar mass densities, as resistivity is a function of the structure of the material. In addition, CAVAD deposition does not involve any hazardous gas or environmentally dangerous products compared with other coating technologies. It is "waste free", environmentally safe, and gives off no appreciable by-products.

The potential applications of this technique include deposition of metal films where good adhesion and high deposition rate is required; high quality metal coatings and compound coatings for optical applications, alloy depositions for good electrical contacts in microelectronics, deposition of high purity Si-coatings for lining the inside of vacuum chambers such as those used in conventional ion implanters, plasma etchers and plasma CVD so as to eliminate the emission of impurities (surface gas evolution) off the walls of these systems, and material surface coatings to enhance the mechanical and electrochemical performance; deposition of compounds like nitrides and carbides for high mechanical strength; deposition of thin films with special crystal structures like diamond and diamond-like coatings; deposition of silicides for VLSI applications, for example chromium silicide.

Thin film carbon nitrides ($CN_x$) may be deposited on substrates (e.g., silicon wafers or other silicon based materials) by three methods utilizing vacuum arcs in combination with plasma ion implantation (PIII) techniques.

In one embodiment, $C_x$ films are deposited using plasma immersion ion implantation in combination with anodic vacuum arcs (hereinafter referred to as AAPII). In another embodiment, $CN_x$ films are deposited using plasma immersion ion implantation in combination with a continuous cathodic vacuum arc and magnetic duct (hereinafter referred to as CAPII). In another embodiment, $CN_x$ films are deposited using pulsed cathodic vacuum arcs in combination with plasma ion immersion implantation (hereinafter referred to as PCAPII).

The AAPII method deposits carbon films on electrically biased silicon wafers or other substrates utilizing the anodic vacuum arc technique in combination with a consumable anode. During the deposition process of the carbon films, negative voltage pulses are applied to the substrate in order to extract the nitrogen ions from the background plasma and implant them into the substrate to form the $CN_x$ films.

In an alternative embodiment, the CAPII method, deposition of $CN_x$ may be performed with a continuous carbon cathodic arc and a simultaneous nitrogen plasma immersion ion implantation. In this embodiment, an arc method using a continuous cathodic arc supplies a higher flux of ions per unit time (about 144 times faster than the pulsed cathodic arc technique). During the cathodic arc mode, nitrogen gas is passing through the output of the anode of the cathodic arc. This nitrogen is ionized via the cathodic ion source output at the anode and included in the overall ion flux output that moves through the magnetic duct. Simultaneously, the sample is subjected to a background nitrogen plasma generated by either thermionic, RF, or other means, which acts as the dominant source for the nitrogen ions. These ions are attracted and accelerated into the substrate to form the C—N bonds for the resultant $CN_x$ thin film.

In another embodiment, a magnetically filtered pulsed cathodic arc may be used as a plasma source of highly ionized carbon ions. Nitrogen ions are supplied by a nitrogen plasma similar to the CAPII method described above.

The composition and C—N bonding nature of the films were investigated by x-ray photoelectron spectroscopy (XPS). This analysis was performed on a Leybold MAX 200 X-ray photoelectron spectrometer using monochromatised MgKα exciting radiation.

To characterize the adhesion and surface tension properties of the $CN_x$ films, measurements of the advancing contact angle for three droplets of testing liquids on carbon and $CN_x$ films were made. Deionized water having surface tension energy of 72.8 dynes/cm, ethylene glycol with 48.2 dynes/cm and diiodmethylene with surface tension of 50.8 dynes/cm were used. A custom-designed set-up was used and the geometric parameters of the droplets were measured by an optical system and a photo-camera. The sessile drop technique was employed with droplets volumes of 2–3 μl. The contact angle was measured as the tangent angle formed between the liquid and the surface.

Film hardness is measured by a Nanoindenter 1 equipment by Nano Instruments, Inc. It is equipped with a 3 sided diamond—Berkovick indentor. The rate of loading and unloading was 400 μN/sec.

Figure 16:
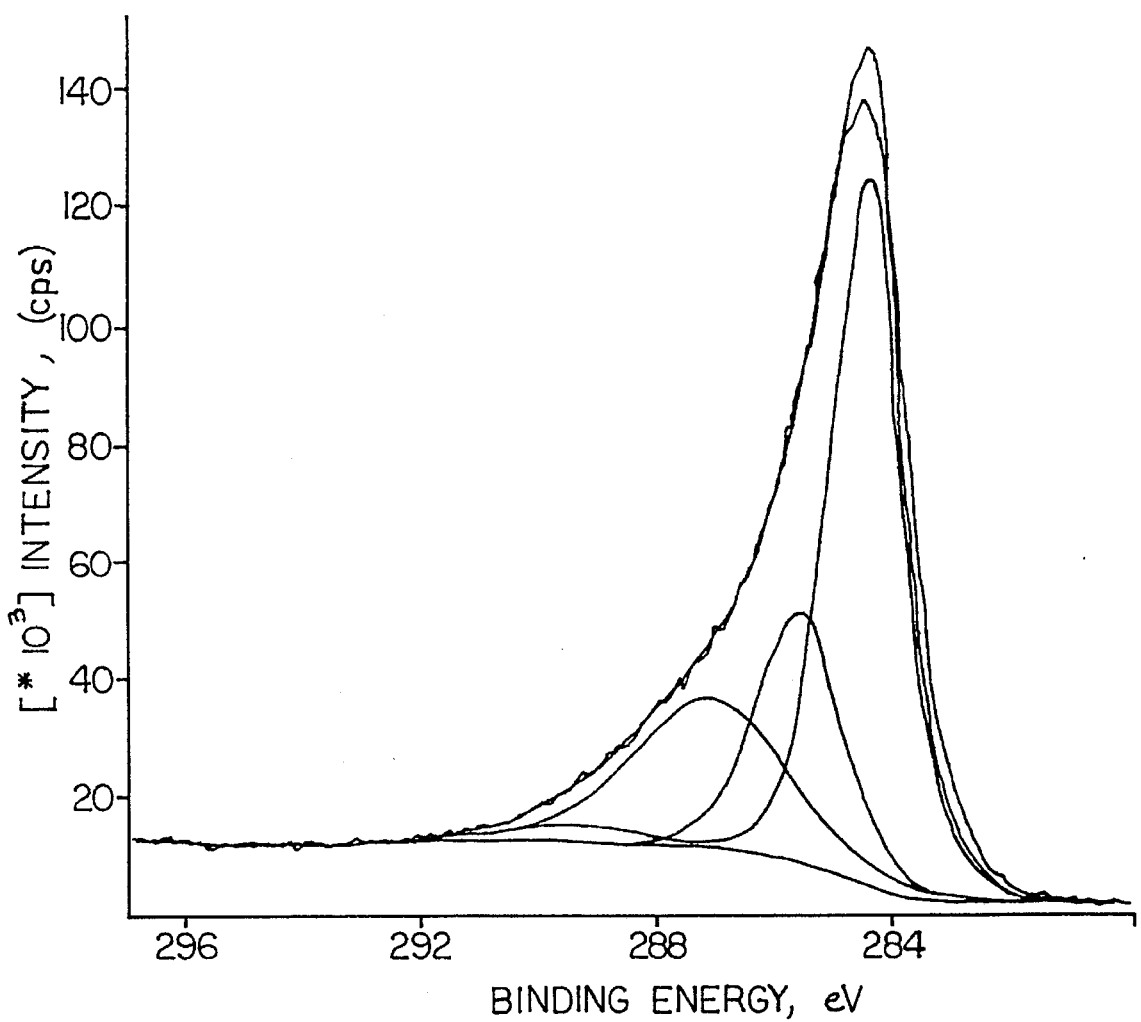
FIG. 16 shows C is spectra of $CN_x$ films prepared by the AAPII and CAPII methods.

A typical high resolution C is spectra obtained by XPS of the $CN_x$ films prepared by the AAPII and CAPII methods is shown in FIG. 16. The peak deconvolution results of a C film and $CN_x$ films with variable [N]/[C] ratios are summarized in Table 1. Four carbon peaks at the binding energies of 284.5 eV, 285.6 eV, 287.1 eV, and 289.3 eV are identified in all the films. Carbon bound to itself, no matter how hybridized, has a characteristic peak at 285.0 eV which is usually used as the binding energy reference. Thus, the peak at 284.5 eV in the high resolution C is spectra indicates a formation of —C—C—C—C— groups. The main graphitic C is peak from a carbon film exhibits an asymmetric tail towards high binding energy. The tail, that is attributed to the interaction of the positive core hole and formed as a result of the primary photoemission process with the conduction electrons (conduction band interaction, CBI). Thus, the peaks at 285.6 eV, 287.1 eV and 289.3 eV can be associated with three different processes, i.e, surface oxidation, formation of carbon-nitrogen bonds and to the CBI mechanism. Table I compares the intensities of these peaks. The ratio of the peak intensity at 285.6 eV to the main peak at 284.5 eV is consistent for both the C film and the $CN_x$ films with a range of 0.44–0.49. This observation suggests that the peak at 285.6 eV is predominantly due to the graphitic structure and can be associated with the CBI mechanism that is intrinsic to the photoemission process. The presence of the peak at 289.3 eV indicates the formation of some C(O) type groups on the surface. Analysis of the ratio changes for the peak at 287.1 eV show that the $CN_x$ films have ratios that increase with the increase of the nitrogen content in the films. These ratios are between 0.4 and 0.6 which are much higher than the ratio of the carbon film (0.23). These observations suggest that the peak at 287.1 eV can be associated with the formation of carbon-nitrogen bonds.

Figure 17:
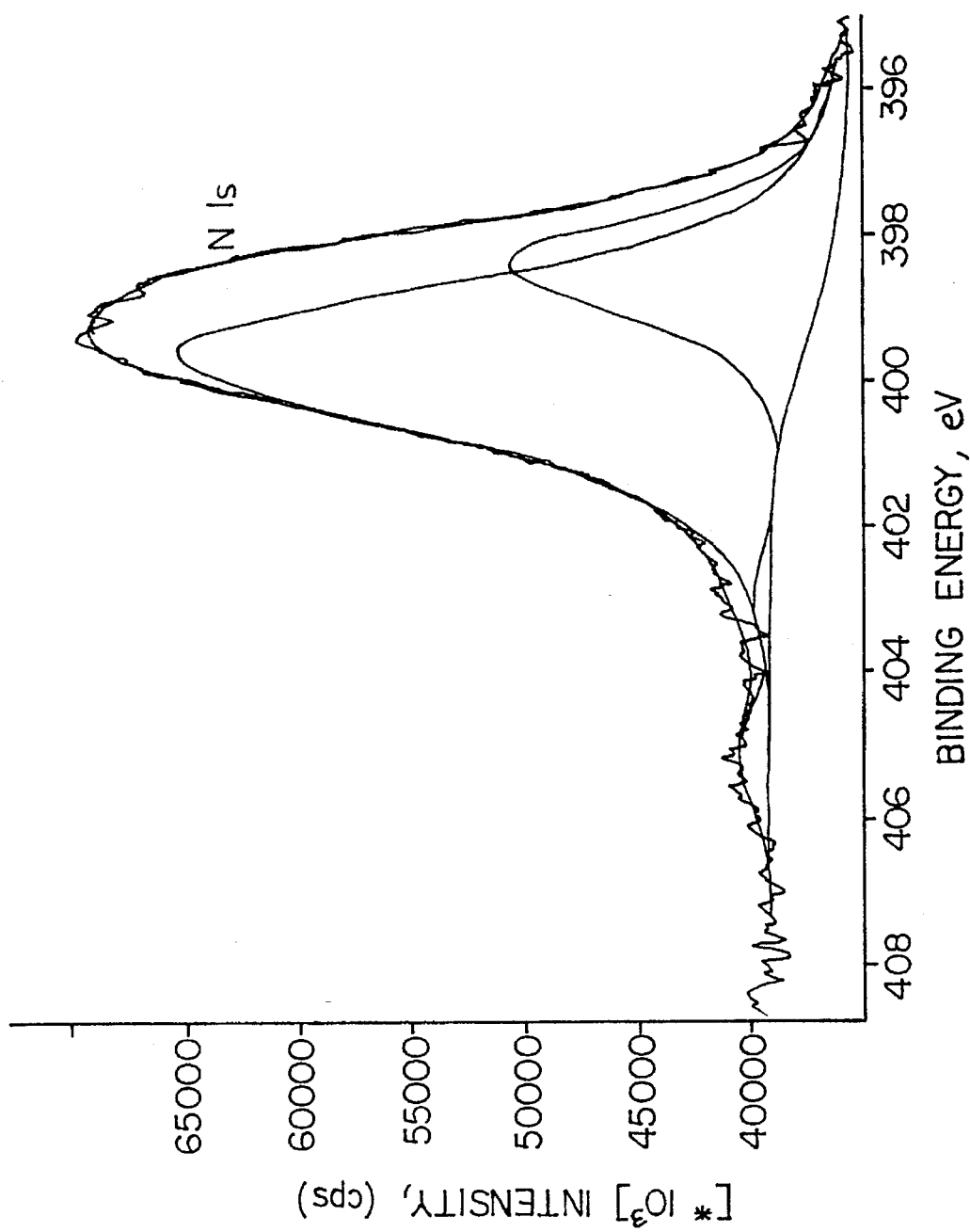
FIG. 17 shows high resolution N is spectra of $CN_x$ films prepared by the AAPII and CAPII methods.

FIG. 17 shows a typical high resolution N is spectra of $CN_x$ films prepared by the AAPII and CAPII methods. Table 1 summarizes the peak deconvolution results. Four nitrogen peaks were identified at binding energies of 398.4 eV, 399 eV, 402.9 eV, and 405.2 eV. The peaks at 402.9 eV and 405.2 eV can be attributed to N(O) bondings. The two major nitrogen peaks at 398.4 eV and 399.7 eV are originating from C—N and C=N bonds respectively. The intensity of the peaks indicate the dominance of the C=N bonds over the C—N bonds. The C—N bonds percentage increase with the increase in the [N]/[C] ratio. Similar XPS results was obtained for the AAPII and CAPII films with similar [N]/[C] ratios. Table 1 shows the similarity between an AAPII film ([N]/[C]=0.135) and a CAPII film ([N]/[C]=0.15).

Figure 18:
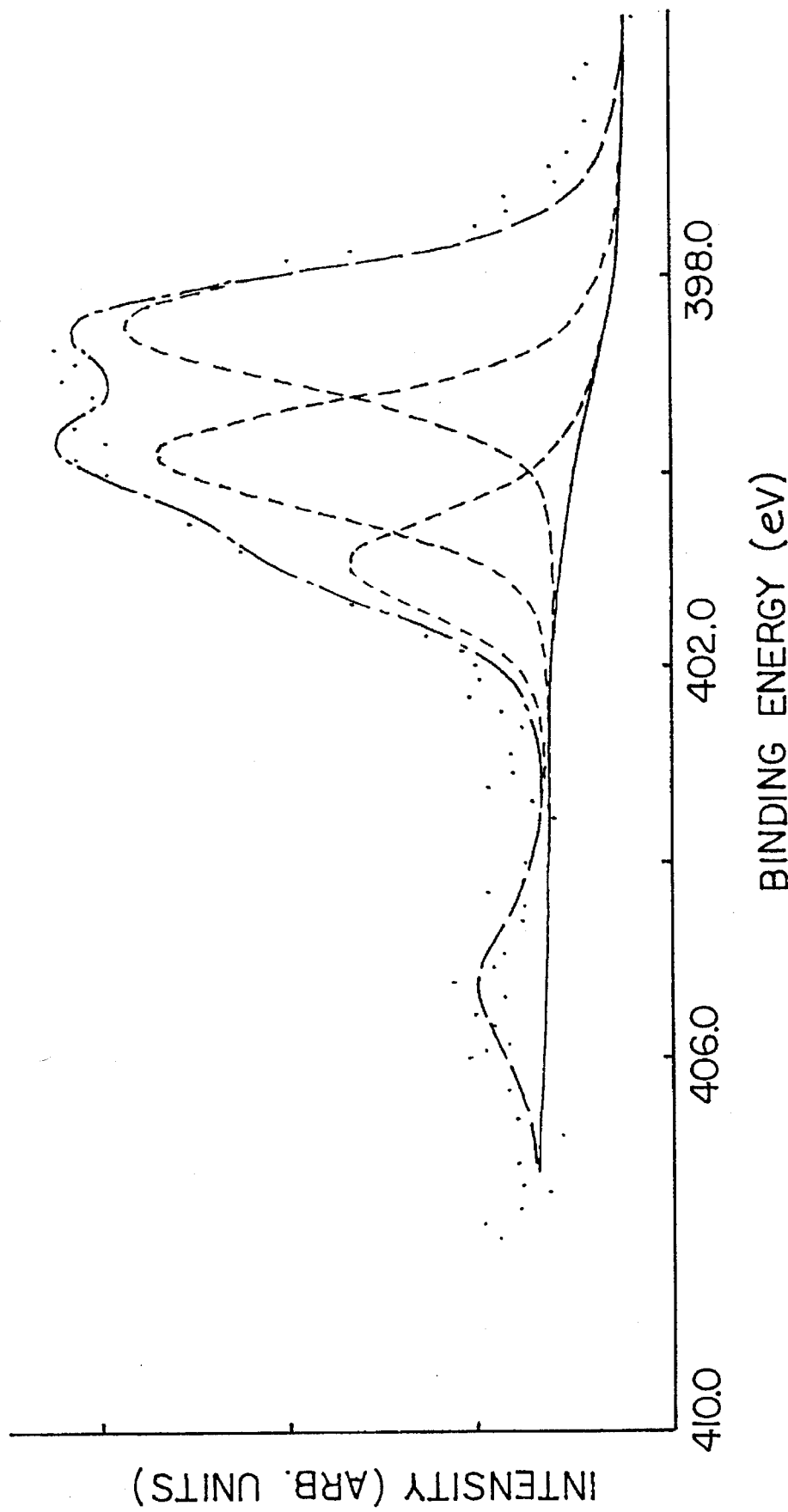
FIG. 18 show the N is spectrum of a $CN_x$ film deposited by PCAPII.

FIG. 18 show the N Is spectrum of a $CN_x$ film deposited by PCAPII with [N]/[C]=0.286. The C—N bond (at a binding energy of 398.6 eV) dominates the C=N (at 399.9 eV) in this film.

Measurement of contact angles is a highly sensitive technique to the composition and properties of surfaces. From the contact angle measurements accurate calculations of the surface tension (and surface free energy) of a solid and the interfacial tension between the deposited film and the substrate can be obtained. Many methods have been proposed to calculate the surface tension of a solid, such as the geometric-mean method, equation of state method, and the harmonic mean method. The later method is considered accurate and preferred over the other methods. Knowledge of the $CN_x$ films surface tension and its components can be helpful in studying the deposited films structures and their adhesion properties.

The results obtained for contact angles with deionized water, ethylene glycol, and diiodomethylene on carbon and $CN_x$ films with variable [N]/[C] ratios prepared by the AAPII and CAPII methods are presented in Table 2. The surface tension ($\lambda_s$) and its dispersion ($\lambda_s^D$) and polar ($\lambda_s^P$) components of the films were calculated using the harmonic mean method. Given the surface tension of the testing liquids and the contact angles, the dispersion and polar components of a solid surface tension can be calculated. Table 3 summarizes these calculations and the polarity ($X^P=\lambda_s^P/\lambda_s$) calculations.

The interfacial tension and the work of adhesion ($W_2$) between the films and the Si wafer (films were deposited on both the polished and rough surfaces of the wafer) is calculated from the dispersion and polar components of the deposited films and the Si substrate. These calculations are summarized in Table 2.

Figure 19:
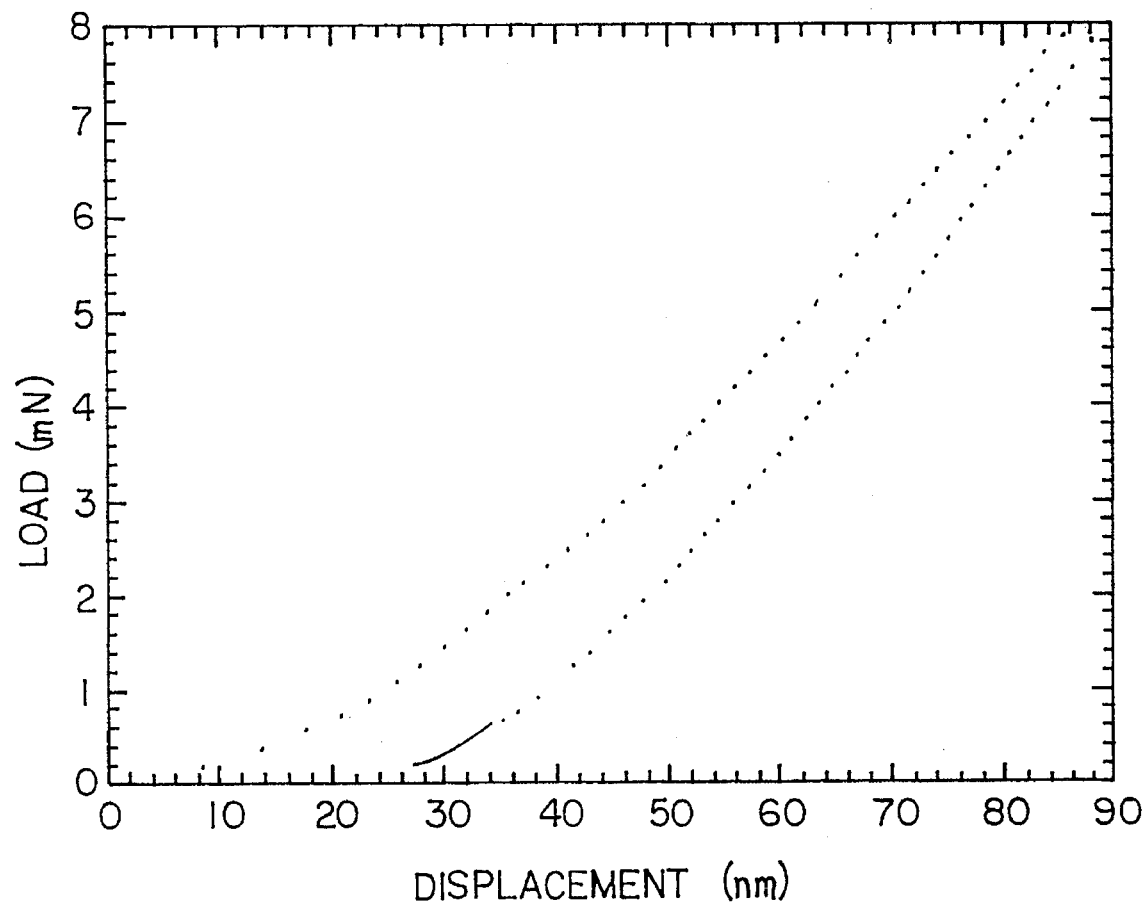
FIG. 19 shows the load-displacement curve of a $CN_x$ film prepared by the AAPII method.

Nanoindentation measurement showed that increasing the nitrogen content of the $CN_x$ films increased the hardness of these films. Hardness of 19 to 22 GPa were obtained for $CN_x$ films compared to carbon films which have a hardness of approximately 16 GPa. FIG. 19 shows the load-displacement curve of a $CN_x$ film with [N]/[C] ratio of 0.135.

The Raman spectrum of the $CN_x$ films shows a peak around 2330 $cm^{-1}$ which is indicative of the formation of C≡N bond in the film. The pure carbon film showed a small peak round the same wavelength with much lower intensity. This can be attributed to the presence of C═C bond.

EXAMPLES

Example I $CN_x$ films prepared by Anodic Arc Plasma Ion Implantation (AAPII Method)

In this method, carbon films were deposited on silicon wafers utilizing the anodic vacuum arc technique. An arc is ignited by an electric trigger between two graphite electrodes of cylindrical geometry and sustained by consumable anode. The anodic vacuum arc produces a partially ionized vapor plasma (less than 20%). Films with thickness around 0.8–1.7 μm (measured by a Dektak 3 surface profilometer) were deposited with a deposition rate of 0.5 μm/min. using currents between 50–60 A. Higher deposition rates can be achieved depending on factors such as the geometry of the electrodes, arc current, and distance between the arc and the substrate.

The background nitrogen plasma was maintained at a working gas pressure on the order of $1.3 \times 10^{-2}$ Pa ($1 \times 10^4$ Torr). Negative voltage pulses were applied to the substrate in order to extract the nitrogen ions from the plasma. Nitrogen ions also diffuse into the films between the high voltage pulses via thermal diffusion. Voltages of 1–2 kV were used with a pulse length of 4–10 μsec (inclusive) and a repetition frequency of 6–14 kHz (inclusive).

Example II $CN_x$ films prepared by Cathodic Arc Plasma Ion Implantation (CAPII Method)

In this method, the pulsed cathodic arc source was modified to run in a continuous mode, e.g. continuous cathodic arc, providing a flux of fully ionized carbon plasma, unlike the partially ionized plasma of the anodic arc. A baffled magnetic duct is attached to the source to filter the macroparticles and neutrals form the carbon ions. Nitrogen is fed into the vacuum chamber with a base pressure at $1.3 \times 10^{-4}$ Pa ($1 \times 10^{-6}$ Torr) and the working pressure is maintained on the order of $1.3 \times 10^{-2}$ Pa ($1 \times 10^{-4}$ Torr). Thermionic emission is used to form a nitrogen plasma background surrounding the silicon substrate. Negative voltage pulses of 2 kV with a 10 μsec pulse duration and a 1 kHz frequency were applied to the substrate. $CN_x$ films of 0.8 μm thickness were deposited with a deposition rate of 0.1 μm/min.

Although the above example describes simultaneous deposition of carbon plasma and nitrogen plasma to form a $CN_x$ film, it is also possible to sequentially deposit the carbon and nitrogen. In this embodiment, the carbon ion flux is first deposited onto the surface of the substrate and is subsequently immersed into a nitrogen plasma to form a $CN_x$ film.

Example III $CN_x$ films prepared by the Pulsed Cathodic Arc and Plasma Ion Implantation (PCAPII Method)

A magnetically filtered pulsed cathodic arc was used as a plasma source of highly ionized carbon ions. The operating parameters were 200–250 A arc current, 1.5 ms pulse duration, and 1–10 pps pulse repetition rate. Nitrogen ions were supplied by a background nitrogen plasma using plasma immersion ion implantation techniques similar to the CAPII method. A negative voltage pulse from −1 to −2 kV was applied to the substrate and used similar to the AAPII method. $C_x$ films of approximately 1.0 μm thickness were deposited using this method.

Although the invention has been shown and described with respect to an illustrative embodiment thereof, it should be appreciated that the foregoing and various other changes, omissions, and additions in the form and detail thereof may be made without departing from the spirit and scope of the invention as delineated in the claims.

TABLE 1

| Peaks | Binding Energy | Carbon film | | N/C = 0.135(AAPII) | | N/C = 0.25(AAPII) | | N/C = 0.15(CAPII) | |
|---|---|---|---|---|---|---|---|---|---|
| | | at. % | Ratio | at. % | Ratio | at. % | Ratio | at. % | Ratio |
| C1s | 284.5 eV | 55.1 | 1.0 | 51.9 | 1.0 | 47.9 | 1.0 | 50.4 | 1.0 |
| | 285.6 eV | 27.2 | 0.49 | 24.2 | 0.46 | 22.1 | 0.46 | 22.2 | 0.44 |
| | 287.1 eV | 12.9 | 0.23 | 20.9 | 0.40 | 29.0 | 0.6 | 24.5 | 0.49 |
| | 289.3 eV | 4.7 | 0.09 | 3.0 | 0.06 | 1.0 | 0.02 | 2.8 | 0.06 |
| N1s | 398.4 eV | — | | 25.1 | | 30.9 | | 25.3 | |
| | 399.7 eV | — | | 71.4 | | 65.2 | | 70.9 | |
| | 402.9 eV | — | | 2.7 | | 3.9 | | 1.5 | |
| | 405.2 eV | — | | 0.9 | | — | | 2.3 | |

TABLE 2

| Film composition and (deposition method) | Advancing Contact Angles (degrees) | | | Substrate Surface (Si) | Surface Tension between films and Si wafer (dyne/cm) | Work of Adhesion (erg/cm$^2$) |
|---|---|---|---|---|---|---|
| | Water | Ethylene glycol | Diiod-methylene | | | |
| C Film (anodic arc) | 77 | 37 | 32 | polished | 10.4 | 69.0 |
| N/C = 0.135 (AAPII) | 68 | 33 | 34 | polished | 5.0 | 73.2 |
| N/C = 0.15 (CAPII) | 69 | 33 | 34 | polished | 5.3 | 73.0 |
| C Film (anodic arc) | 69 | 35 | 36 | rough | 3.9 | 71.3 |
| N/C = 0.25 (AAPII) | 63 | 29 | 41 | rough | 1.5 | 75.5 |

TABLE 3

| Film composition and (deposition method) | Substrate Surface (Si) | Surface Tension Components and the Polarity (dyne/cm) | | | |
|---|---|---|---|---|---|
| | | Dispersion ($\gamma_s^D$) | Polar ($\gamma_s^P$) | Total ($\gamma_s$) $\gamma_s = \gamma_s^D + \gamma_s^P$ | Polarity ($\chi^P$) $\chi^P = \gamma_s^P/\gamma_s$ |
| C Film (anodic arc) | polished | 38.4 | 5.4 | 43.8 | 0.12 |
| N/C = 0.135 (AAPII) | polished | 33.6 | 9.0 | 42.6 | 0.21 |
| N/C = 0.15 (CAPII) | polished | 34.0 | 8.7 | 42.7 | 0.20 |
| C Film (anodic arc) | rough | 32.5 | 10.0 | 42.5 | 0.24 |
| N/C = 0.25 (AAPII) | rough | 25.0 | 18.8 | 43.8 | 0.43 |
| Si wafer | polished | 20.3 | 15.3 | 35.6 | 0.43 |
| Si wafer | rough | 18.5 | 14.7 | 33.2 | 0.44 |

We claim:

1. A method for depositing a $CN_x$ film on a substrate, comprising the step of:

providing a vacuum chamber;

providing a substrate positioned within said vacuum chamber;

providing a consumable carbon-based anode and a cathode;

ingiting an arc between said consumable carbon-based anode and said cathode to produce a partially ionized carbon vapor;

depositing said partially ionized carbon vapor on said substrate to form a carbon film thereon;

providing a nitrogen plasma;

immersing said substrate deposited with said carbon film into said nitrogen plasma; and implanting said carbon film with nitrogen ions from said nitrogen plasma to form a $CN_x$ film.

2. The method of claim 1, wherein in said implanting step, said substrate is pulsed with a negative voltage.

3. The method of claim 2, wherein said negative voltage is in the range of approximately −50 to −2000 volts.

4. The method of claim 2, wherein the pulse time is in the range of approximately 3 to 10 μsec.

5. The method of claim 1, wherein in said implanting step, said nitrogen plasma is maintained at a pressure of approximately $10^{-4}$ Torr.

6. The method of claim 1, wherein said substrate is made of silicon.

7. The method of claim 6, wherein said substrate is a silicon wafer.

8. The method of claim 1, wherein said substrate is a magnetic computer disk.

9. The method of claim 1, wherein said $CN_x$ film is formed to a thickness in the range of approximately 0.8 to 1.7 μm.

10. The method of claim 1, wherein the formation rate of said $CN_x$ film is approximately 0.5 μm per min.

11. The method of claim 1, wherein said partially ionized carbon vapor is approximately 20% ionized.

12. The method of claim 1, wherein said nitrogen plasma is produced by thermionic emission.

13. The method of claim 1, wherein said nitrogen plasma is produced by RF excitation.

14. The method of claim 1, wherein said nitrogen plasma is produced by the energy of said cathode.

15. A method for depositing a $CN_x$ film on a substrate, comprising the steps of:

providing a vacuum chamber with a curved magnetic duct, said vacuum chamber including nitrogen gas;

providing a substrate positioned within said vacuum chamber;

providing a cathode positioned at an end of said curved magnetic duct, said cathode comprising a carbon-based material;

igniting a cathodic arc, said cathodic arc operating in a continuous mode and forming a carbon ion flux, said nitrogen gas forming a plasma;

passing said carbon ion flux through said curved magnetic duct and onto said substrate;

implanting said carbon ion flux and nitrogen ions from said nitrogen plasma onto said substrate to form a $CN_x$ film thereon.

16. The method of claim 15, wherein said carbon ion flux is a highly ionized carbon ion flux.

17. The method of claim 15, wherein said substrate is made of silicon.

18. The method of claim 17, wherein said substrate is a silicon wafer.

19. The method of claim 15, wherein said nitrogen gas in said vacuum chamber is maintained at a pressure of approximately $10^{-4}$ Torr.

20. The method of claim 15, wherein in said implanting step, said substrate is pulsed with a negative voltage.

21. The method of claim 20, wherein said negative voltage is in the range of approximately −50 to approximately −2000 volts.

22. The method of claim 20, wherein the pulse time is in the range of from approximately 4 μsec to approximately 10 μsec.

23. The method of claim 20, wherein the frequency of said pulsing is in the range of from approximately 6 to approximately 14 Khz.

24. The method of claim 15, wherein said $CN_x$ film is formed to a thickness of approximately 0.8 μm.

25. The method of claim 15, wherein the formation rate of said $CN_x$ film is approximately 0.1 μm per min.

26. The method of claim 15, wherein said nitrogen plasma is produced by thermionic emission.

27. The method of claim 15, wherein said nitrogen plasma is produced by RF excitation.

28. The method of claim 15, wherein said nitrogen plasma is produced by the energy of said cathodic arc.

29. A method for depositing a $CN_x$ film on a substrate, comprising the steps of:

providing a vacuum chamber with a curved magnetic duct, said vacuum chamber including nitrogen gas;

providing a substrate positioned within said vacuum chamber;

providing a cathode positioned at an end of said curved magnetic duct, said cathode comprising a carbon-based material;

igniting a cathodic arc, said cathodic arc operating in a pulsing mode and forming a carbon ion flux;

providing a nitrogen plasma;

passing said carbon ion flux through said curved magnetic duct and onto said substrate;

implanting said carbon ion flux and nitrogen ions from said nitrogen plasma onto said substrate to form a $CN_x$ film.

30. The method of claim 29, wherein said carbon ion flux is a highly ionized carbon ion flux.

31. The method of claim 29, wherein said substrate is made of silicon.

32. The method of claim 29, wherein said nitrogen gas in said vacuum chamber is maintained at a pressure of approximately $10^{-4}$ Torr.

33. The method of claim 29, wherein in said implanting step, said substrate is pulsed with a negative voltage.

34. The method of claim 33, wherein said negative voltage is in the range of approximately −50 to approximately −2000 volts.

35. The method of claim 33, wherein the pulse time is in the range of from approximately 4 μsec to approximately 8 μsec.

36. The method of claim 33, wherein the frequency of said pulsing is in the range of approximately 6 Khz to approximately 14 Khz.

37. The method of claim 29, wherein said $CN_x$ film is formed to a thickness of approximately 1.0 μm.

38. The method of claim 29, wherein the pulse rate of said cathode operating in said pulsing mode are in the range of approximately 1 to 10 per second.

39. The method of claim 29, wherein the duration of the pulses of said cathode operating in said pulsing mode are approximately 1.5 msec.

40. The method of claim 29, wherein said nitrogen plasma is produced by thermionic emission.

41. The method of claim 29, wherein said nitrogen plasma is produced by RF excitation.

42. The method of claim 29, wherein said nitrogen plasma is produced by the energy of the cathodic arc.

* * * * *

UNITED STATES PATENT AND TRADEMARK OFFICE
CERTIFICATE OF CORRECTION

PATENT NO. : 5,580,429
DATED : December 3, 1996
INVENTOR(S) : Chung Chan, et al.

It is certified that error appears in the above-identified patent and that said Letters Patent is hereby corrected as shown below:

Column 4, line 57, "C-N bonds." should read --C≡N bonds.--.

Column 5, line 49, "C is" should read --C 1s--.

Column 5, line 51, "N is" should read --N 1s--.

Column 5, line 53, "N is" should read --N 1s--.

Column 15, line 50, "C is" should read --C 1s--.

Column 15, line 61, "C is" should read --C 1s--.

Column 16, line 17, "N is" should read --N 1s--.

Column 16, line 31, "N Is" should read --N 1s--.

Column 18, line 36, "$C_x$ films" should read --$CN_x$ films--.

Column 19, Table 2, line 9, "(AAPH)" should read --(AAPII)--.

Column 19, claim 4, line 67, "3 to 10" should read --4 to 10--.

Signed and Sealed this

Eighth Day of September, 1998

Attest:

BRUCE LEHMAN

*Attesting Officer*   *Commissioner of Patents and Trademarks*